(12) United States Patent
Yamamoto et al.

(10) Patent No.: US 9,531,377 B2
(45) Date of Patent: Dec. 27, 2016

(54) SEMICONDUCTOR DEVICE

(71) Applicant: Mitsubishi Electric Corporation, Tokyo (JP)

(72) Inventors: Koji Yamamoto, Tokyo (JP); Shinsuke Godo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/766,966

(22) PCT Filed: Apr. 2, 2013

(86) PCT No.: PCT/JP2013/060036
§ 371 (c)(1),
(2) Date: Aug. 10, 2015

(87) PCT Pub. No.: WO2014/162507
PCT Pub. Date: Oct. 9, 2014

(65) Prior Publication Data
US 2015/0381170 A1 Dec. 31, 2015

(51) Int. Cl.
*H03K 3/00* (2006.01)
*H03K 17/687* (2006.01)
(Continued)

(52) U.S. Cl.
CPC ............ *H03K 17/687* (2013.01); *F02P 3/055* (2013.01); *F02P 3/08* (2013.01); *F02P 3/096* (2013.01);
(Continued)

(58) Field of Classification Search
None
See application file for complete search history.

(56) References Cited

U.S. PATENT DOCUMENTS 5,502,399 A   3/1996  Imai
6,075,391 A * 6/2000  Tarantola ............ H03K 17/063
                                                  327/111
(Continued)

FOREIGN PATENT DOCUMENTS

JP   H07-142711 A   6/1995
JP   H09-172358 A   6/1997
(Continued)

OTHER PUBLICATIONS

International Search Report for PCT/JP2013/060036 dated May 7, 2013.
(Continued)

*Primary Examiner* — Long Nguyen
(74) *Attorney, Agent, or Firm* — Studebaker & Brackett PC

(57) ABSTRACT

The present invention has an object to provide a semiconductor device that has protective functions and is capable of achieving miniaturization and cost reduction. A semiconductor device according to the present invention includes a switching element, a drive circuit, and a control circuit. When a high-level drive control signal is output from the drive circuit, the control circuit stops driving of the switching element and charges an electric charge storing capacitor. When a low-level drive control signal is output from the drive circuit, the control circuit drives the switching element using electric charges stored in the electric charge storing capacitor.

20 Claims, 25 Drawing Sheets

(51) Int. Cl.
  *F02P 3/055*  (2006.01)
  *F02P 3/08*  (2006.01)
  *F02P 3/09*  (2006.01)
  *H03K 17/082*  (2006.01)
  *H03K 17/16*  (2006.01)

(52) U.S. Cl.
  CPC ........ *H03K 17/0828* (2013.01); *H03K 17/168* (2013.01)

(56) References Cited

U.S. PATENT DOCUMENTS

| | | | |
|---|---|---|---|
| 6,336,448 | B1 | 1/2002 | Furuhata et al. |
| 8,258,820 | B2* | 9/2012 | Strzalkowski ....... H03K 17/163 327/108 |
| 8,861,175 | B2 | 10/2014 | Godo et al. |
| 2005/0104650 | A1* | 5/2005 | Feldtkeller ............... H03K 4/00 327/427 |
| 2014/0035627 | A1* | 2/2014 | Dunipace ............... H03K 3/012 327/109 |

FOREIGN PATENT DOCUMENTS

| | | |
|---|---|---|
| JP | H11-205112 A | 7/1999 |
| JP | 2002-004991 A | 1/2002 |
| JP | 2008-042214 A | 2/2008 |
| JP | 2010-226835 A | 10/2010 |
| JP | 2011-127445 A | 6/2011 |

OTHER PUBLICATIONS

Notification of Transmittal of Translation of the International Preliminary Report on Patentability and Translation of Written Opinion of the International Searching Authority; PCT/JP2013/060036 issued on Oct. 15, 2015.

* cited by examiner

F I G . 1
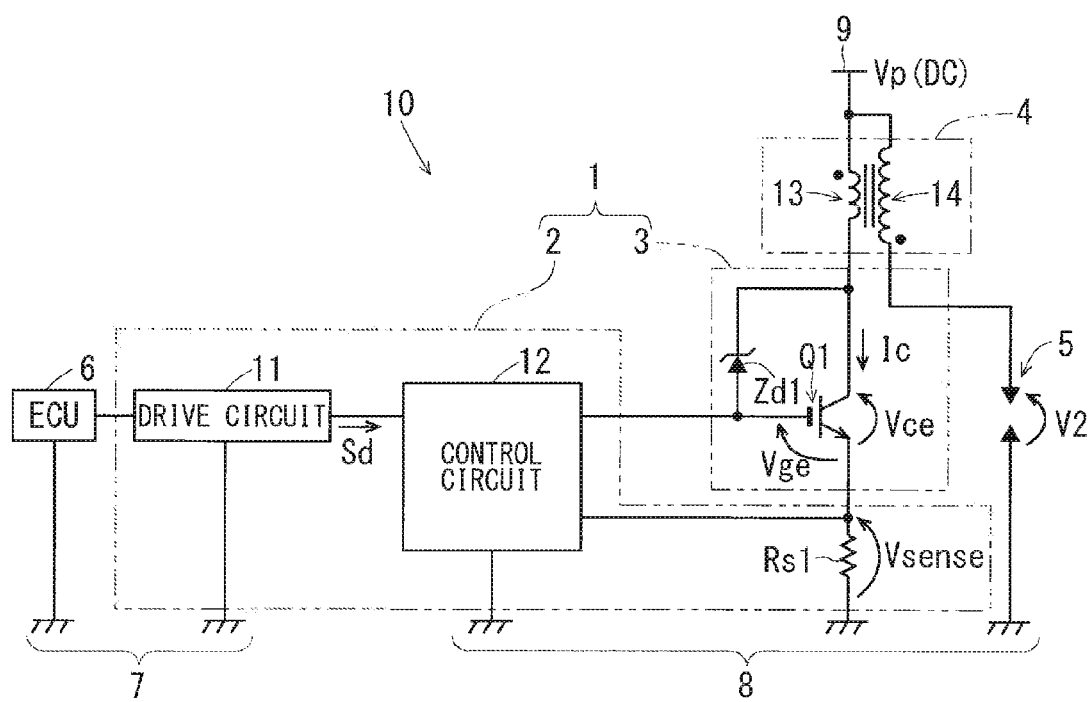

F I G. 2
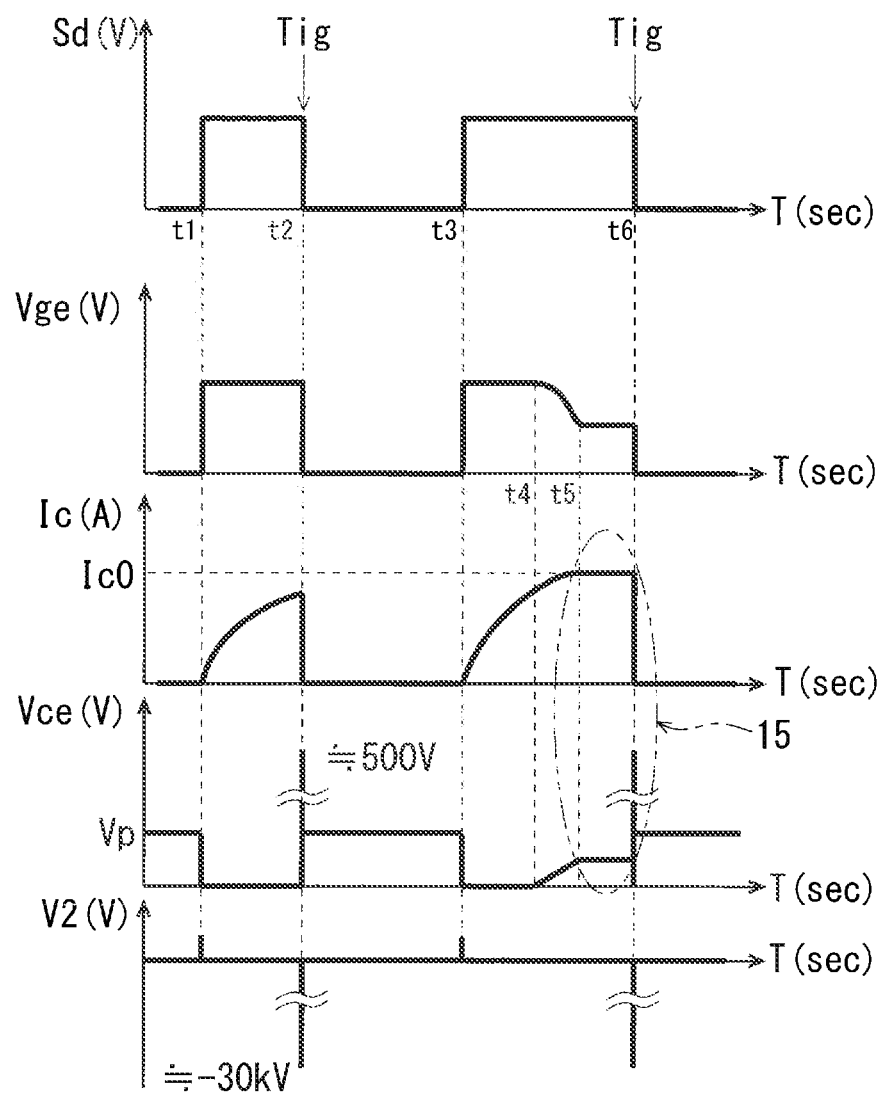

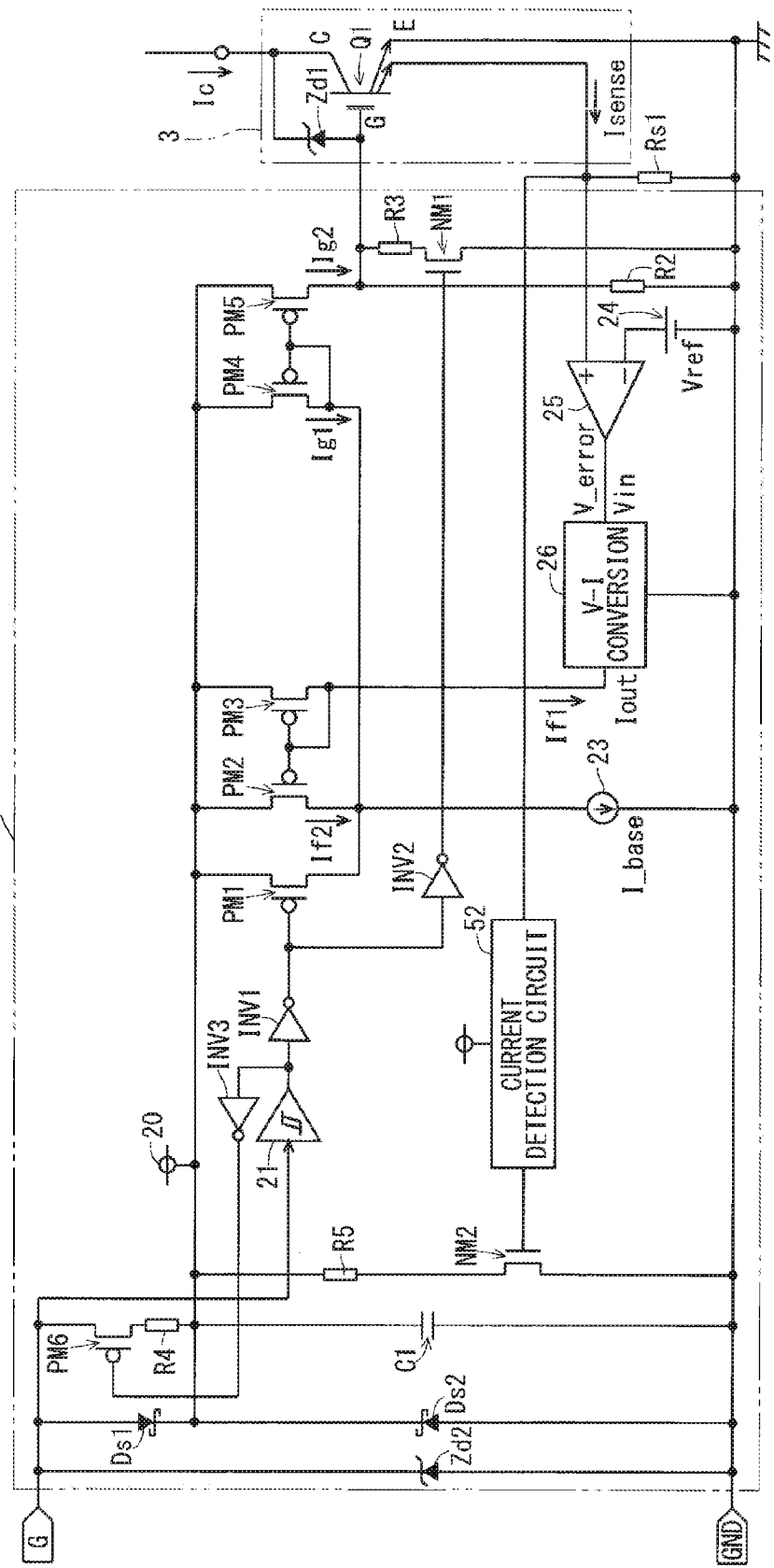
F I G. 9

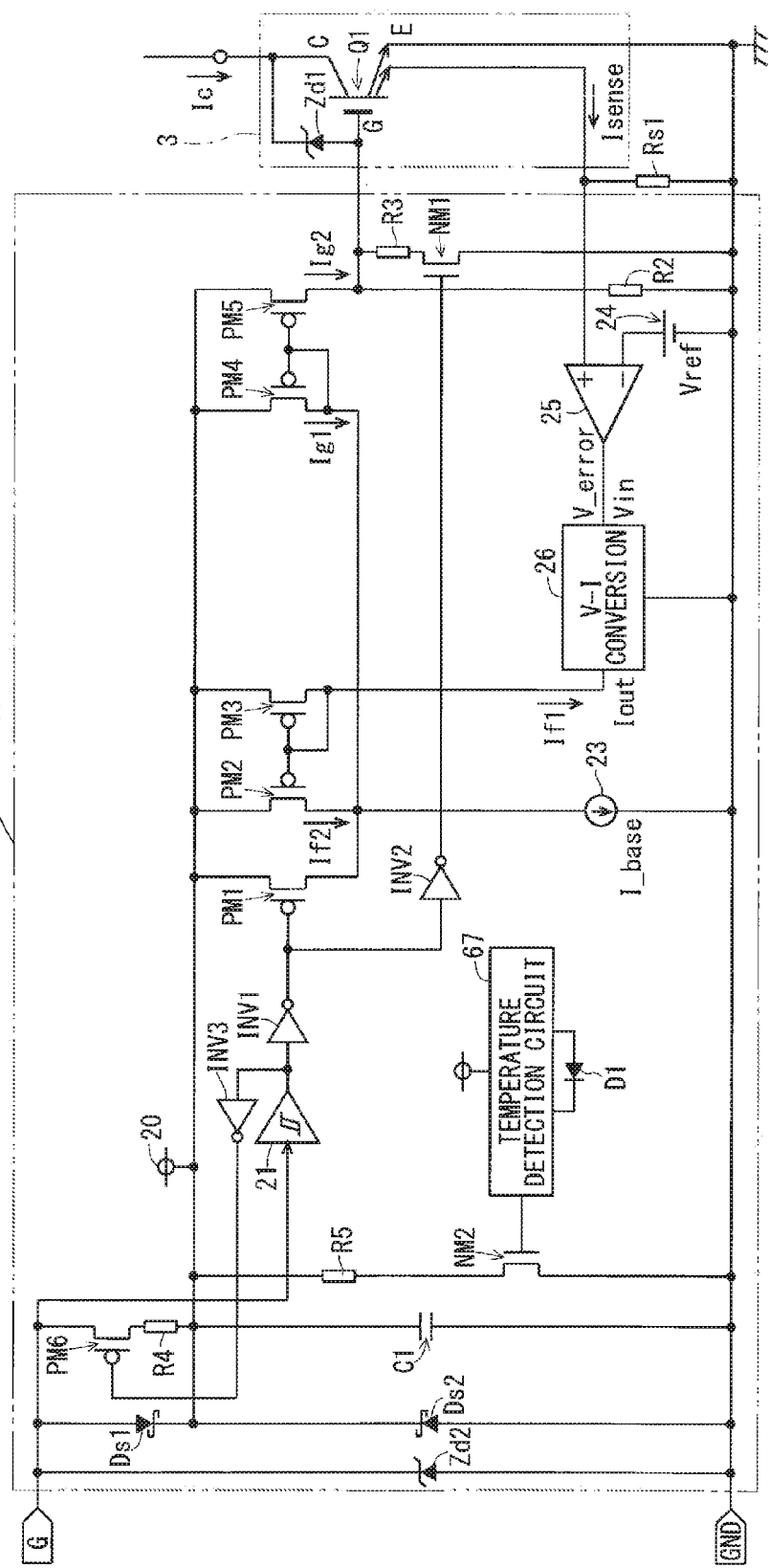
F I G. 1 2

F I G . 1 9
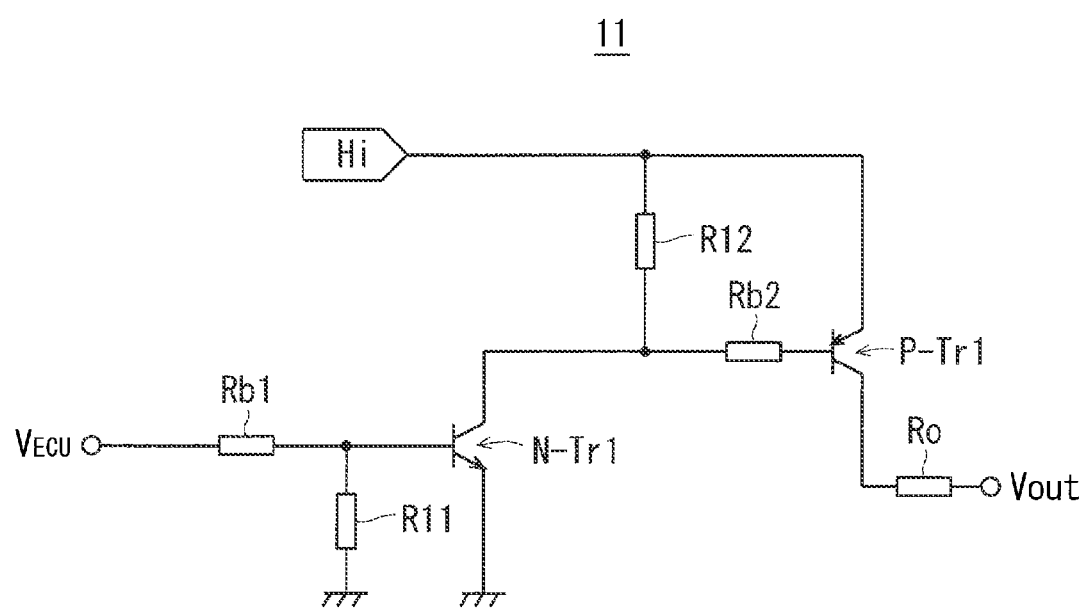

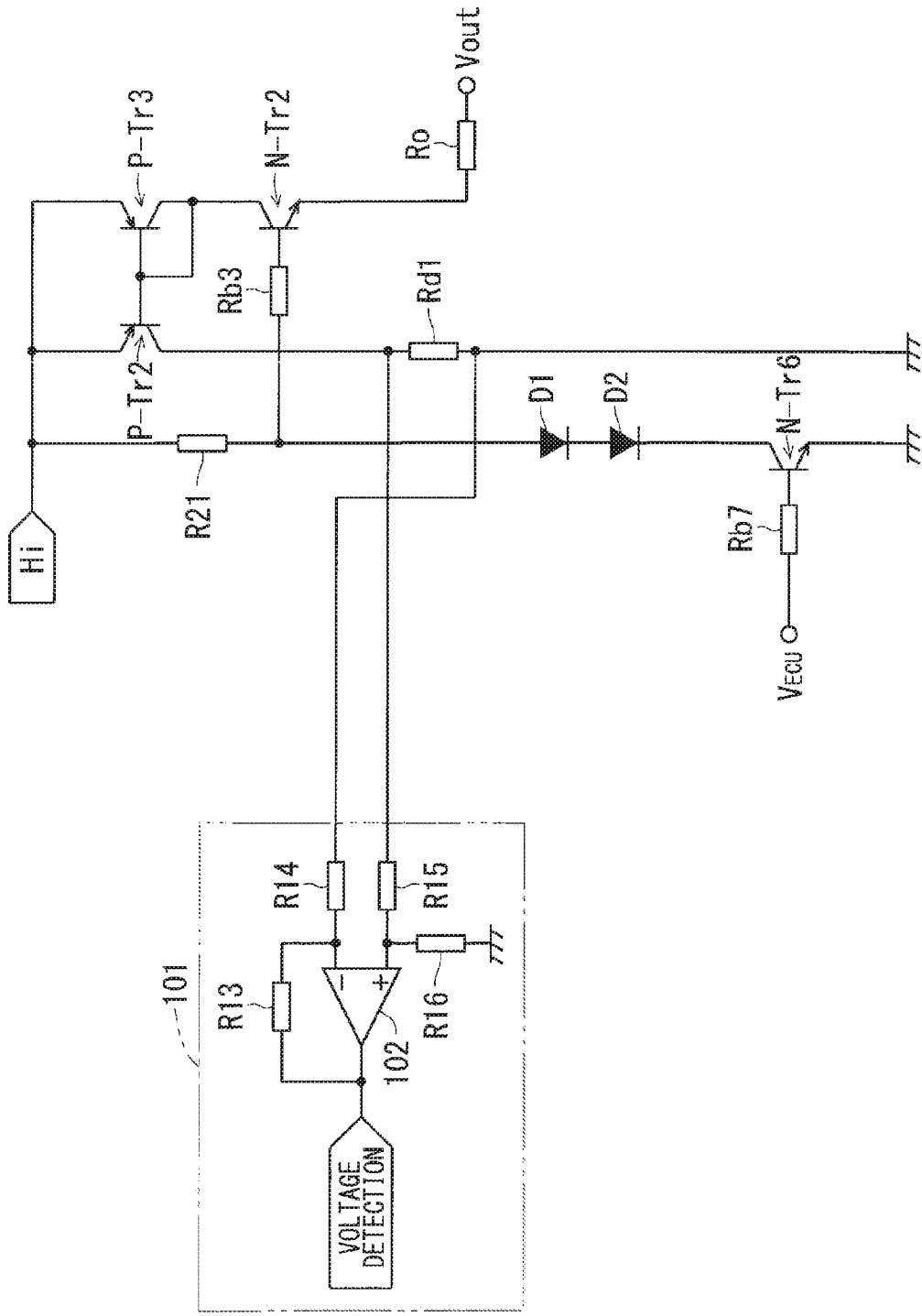
F I G. 25

SEMICONDUCTOR DEVICE

TECHNICAL FIELD

The present invention relates to a semiconductor device and more particularly to the semiconductor device that drives an inductive load through a switching element in the ignition system of an internal combustion engine.

BACKGROUND ART

The ignition system for internal-combustion engines including motorcar engines causes an engine ignition through an inductive load, such as a transformer. The transformer is driven by a switching element of a semiconductor device. The switching element is operated by a drive circuit on the basis of a firing signal output from a computer for controlling the engine.

The semiconductor device employed in the ignition system is equipped with protection functions (see, for example, Patent Documents 1 to 4). For example, the semiconductor device is equipped with the function of interrupting the load current in order to avoid a breakdown caused by burnout in a case where the ON signal is continuously applied for a predetermined time or more. Under ordinary circumstances, the operation of interrupting the load current, which is the interruption operation performed by the semiconductor device in order to protect itself, is highly likely to be performed at a timing different from that for outputting the firing signal from the computer for controlling the engine.

The problems including an engine backfire or an engine knocking may occur depending on the timing of the interruption operation. As a result, the machine mechanism of the engine could be broken in the worst case. In order to prevent these problems, the semiconductor device is equipped with the function of providing the slow interruption of load current and preventing unnecessary ignition operation. The semiconductor device further includes provisions for an abnormal temperature and an overcurrent in order to protect itself. Thus, the semiconductor device is configured to minimize the risk of erroneous ignition.

In a case where the signal level of the output signal output from the drive circuit is the Low level, the electric potential of the power semiconductor ground (hereinafter also referred to as "power GND"), to which the power semiconductor device included in the ignition system as the semiconductor device is connected, may decrease to about −60 V due to the application of, for example, surge. The wiring extended to the battery ground (hereinafter also referred to as "battery GND") to which the battery is connected affects such decrease.

When the electric potential of the power GND decreases to about −60 V while the signal level of the output signal output from the drive circuit is the Low level, the semiconductor device may malfunction, causing the switching element to perform the ON operation again. To prevent this, the semiconductor device has, as the protection function, the function of preventing unnecessary ignition operation such that the semiconductor device does not operate in response to a short-pulse signal such as a surge.

PRIOR ART DOCUMENTS

Patent Documents

Patent Document 1: Japanese Patent Application Laid-Open No. 09-172358 (1997)

Patent Document 2: Japanese Patent Application Laid-Open No. 11-205112 (1999)

Patent Document 3: Japanese Patent Application Laid-Open No. 07-142711 (1995)

Patent Document 4: Japanese Patent Application Laid-Open No. 2010-226835

SUMMARY OF INVENTION

Problems to be Solved by the Invention

As disclosed in Patent Documents 1 to 4 mentioned above, the semiconductor device employed in the ignition system is equipped with the protection functions. These protection functions lead to an increase in the circuit size of the semiconductor device, hindering the cost reduction and the miniaturization.

An object of the present invention is to provide a semiconductor device that has protection functions and is capable of achieving miniaturization and cost reduction.

Means to Solve the Problems

A semiconductor device according to the present invention includes: a switching element; a drive circuit that outputs, on the basis of a control signal provided from an external control device, a drive control signal for driving the switching element; and a control circuit that controls driving of the switching element on the basis of the drive control signal output from the drive circuit. The drive circuit is configured to output the drive control signal in a low level having a relatively low signal level in a case where the control signal is a signal for driving the switching element, and output the drive control signal in a high level having a relatively high signal level in a case where the control signal is a signal for stopping the driving of the switching element. The control circuit includes an electric charge storing capacitor for storing electric charges and is configured to stop the driving of the switching element and charge the electric charge storing capacitor in a case where the drive control signal output from the drive circuit is in the high level, and drive the switching element using electric charges stored in the electric charge storing capacitor in a case where the drive control signal output from the drive circuit is in the low level.

Effects of the Invention

In the semiconductor device according to the present invention, when the drive control signal in the high level is output from the drive circuit, the control circuit stops the driving of the switching element and charges the electric charge storing capacitor. When the drive control signal in the low level is output from the drive circuit, the control circuit drives the switching element using electric charges stored in the electric charge storing capacitor.

As described above, the electric charges stored in the electric charge storing capacitor of the control circuit are used to drive the switching element. Thus, in a case where the switching element is continuously energized, electricity is discharged from the electric charge storing capacitor as a result of power consumption by the control circuit. The discharging leads to a gradual decrease in the drive voltage that is required to bring the switching element into conduction for allowing a current to flow. Consequently, a current flowing through the switching element can be slowly interrupted, which protects the semiconductor device. While the drive control signal output from the drive circuit is in the high level, the electric charge storing capacitor is charged but the switching element is not driven, which prevents unwanted conduction of the switching element and therefore protects the semiconductor device.

Thus, according to the present invention, the protection functions can be provided without any additional protection circuit. This provides the semiconductor device that has the protection functions and is capable of achieving miniaturization and cost reduction.

These and other objects, features, aspects and advantages of the present invention will become more apparent from the following detailed description of the present invention when taken in conjunction with the accompanying drawings.

BRIEF DESCRIPTION OF DRAWINGS

FIG. 1 A diagram showing an example of a configuration of an ignition device 10.

FIG. 2 A timing chart showing an operation of a semiconductor device 1.

FIG. 9 A diagram showing a configuration of a control circuit 51 and the switching element part 3 of a semiconductor device 50 according a fifth embodiment of the present invention.

FIG. 12 A diagram showing a configuration of a control circuit 66 and the switching element part 3 of a semiconductor device 65 according to an eighth embodiment of the present invention.

FIG. 19 A diagram showing a drive circuit 11 of the semiconductor 1 according to the underlying technique of the present invention.

FIG. 25 A diagram showing a configuration of a drive circuit 125 according to an eighteenth embodiment of the present invention.

DESCRIPTION OF EMBODIMENTS

First Embodiment

Figure 3:
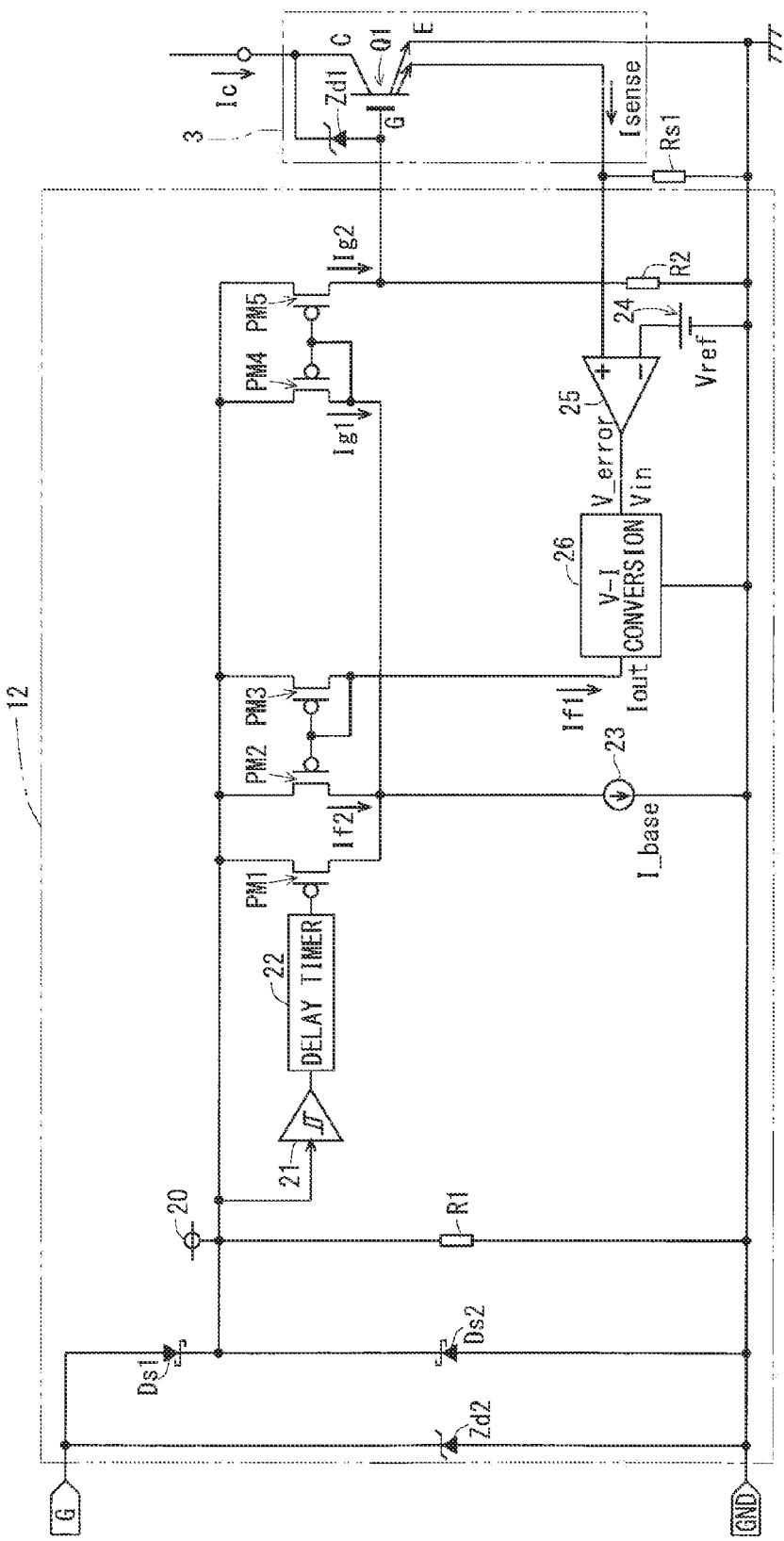
FIG. 3 A diagram showing a configuration of a control circuit 12 and a switching element part 3 of the semiconductor device 1 according to an underlying technique of the present invention.

FIG. 1 is a diagram showing an example of a configuration of an ignition device 10. The ignition device 10 is included in the ignition system that is the system for igniting an internal-combustion engine, such as a motorcar engine. The ignition device 10 includes a semiconductor device 1, an ignition transformer 4, an ignition plug 5, an electronic control unit (ECU for short) 6, and a power source 9.

The semiconductor device 1 includes an integrated circuit 2 and a switching element part 3. The integrated circuit 2 includes a drive circuit 11, a control circuit 12, and a current detection resistor Rs1. The switching element part 3 includes, as a switching element, a power semiconductor element, particularly, an insulated gate bipolar transistor (IGBT for short) Q1. The switching element part 3 includes a Zener diode Zd1. The ignition transformer 4 includes a primary coil 13 and a secondary coil 14.

The ECU 6 is connected with the drive circuit 11 and a control ground 7. The ECU 6 is a control computer and includes a central processing unit (CPU for short). ECU 6 is equivalent to the control device.

The ECU 6 provides the drive circuit 11 with a control signal Sd for controlling the IGBT Q1 that is the switching element of the switching element part 3. The drive circuit 11 is connected to the control circuit 12 and the control ground 7. The drive circuit 11 provides the control circuit 12 with the control signal Sd provided from the ECU 6. The control signal Sd output from the drive circuit 11 to the control circuit 12 is equivalent to the drive control signal.

The control circuit 12 is connected with the IGBT Q1 and the Zener diode Zd1 that are included in the switching element part 3, the current detection resistor Rs1, and a power semiconductor ground 8. In particular, the control circuit 12 is connected with the gate of the IGBT Q1 and the anode of the Zener diode Zd1.

The control circuit 12 generates a drive signal Vge for driving the IGBT Q1 of the switching element part 3 on the basis of the control signal Sd provided from the drive circuit 11 and the predetermined operating conditions. The control circuit 12 provides the generated drive signal Vge to the gate of the IGBT Q1. In this way, the control circuit 12 controls the driving of the IGBT Q1.

The collector of the IGBT Q1 is connected with one end of the primary coil 13 of the ignition transformer 4 and the cathode of the Zener diode Zd1. The other end of the primary coil 13 of the ignition transformer 4 is connected with the power source 9. The anode of the Zener diode Zd1 is connected with the gate of the IGBT Q1 and the control circuit 12. One end of the secondary coil 14 of the ignition transformer 4 is connected with the power source 9. The other end of the primary coil 14 of the ignition transformer 4 is connected with one end of the ignition plug 5. The other end of the ignition plug 5 is connected with the power semiconductor ground 8.

The Zener diode Zd1 is located between the collector and the gate of the IGBT Q1 in order to prevent the dielectric breakdown of the winding of the primary coil 13 and the secondary coil 14 included in the ignition transformer 4. The Zener diode Zd1 is the clamping Zener diode for fixing (clamping) a voltage (hereinafter also referred to as "collector-to-emitter voltage") Vce between the collector and the emitter of the IGBT Q1 at the predetermined voltage. The Zener diode Zd1 clamps the collector-to-emitter voltage Vce across the IGBT Q1 at, for example, about 50 V.

The emitter of the IGBT Q1 is connected with one end of the current detection resistor Rs1. The other end of the current detection resistor Rs1 is connected with the power semiconductor ground 8. The one end of the current detection resistor Rs1 is connected with the control circuit 12. The control circuit 12 detects the emitter current flowing into the emitter of the IGBT Q1 by converting the current to a sense voltage Vsense through the current detection resistor Rs1.

In particular, the control circuit 12 detects, as the sense voltage Vsense, the potential difference between the one end of the current detection resistor Rs1 and the power semiconductor ground 8. The control circuit 12 finds the emitter current flowing into the emitter of the IGBT Q1 on the basis of the detected sense voltage Vsense and the resistance value of the current detection resistor Rs1. The emitter current found in this way is hereinafter referred to as a sense current Isense.

The ignition device 10 operates as described below. When the ON single for turning on the IGBT Q1 of the switching element part 3 is provided, as the control signal Sd, from the ECU 6 to the semiconductor device 1 of the ignition device 10, the ON signal from the ECU 6 is received by the control terminal of the control circuit 12 through the drive circuit 11. The control circuit 12 drives the IGBT Q1 on the basis of the received ON signal. Consequently, the semiconductor device 1 causes a current to flow through the ignition transformer 4, which is a load.

At the timing of ignition, the ECU 6 provides, as the control signal Sd, the OFF signal for turning off the IGBT Q1. In the semiconductor device 1, the control terminal of the control circuit 12 receives the OFF signal from the ECU 6 through the drive circuit 11. The control circuit 12 turns off the IGBT Q1 on the basis of the received OFF signal and interrupts the conduction between the collector and the emitter of the IGBT Q1.

The interruption of the conduction between the collector and the emitter of the IGBT Q1 causes an increase in the collector-to-emitter voltage Vice across the IGBT Q1, so that the high voltage multiplied by the ratio of the number of turns is induced in the secondary coil 14 of the ignition transformer 4 and is applied onto the ignition plug 5 as an ignition voltage V2. The ignition voltage V2 is, for example, equal to or more than −30 kV.

FIG. 2 is a timing chart showing an operation of the semiconductor device 1. To show the operation of the semiconductor device 1, FIG. 2 provides the timing chart illustrating the changes in the control signal Sd (V) provided from the ECU 6 to the control circuit 12 through the drive circuit 11, the drive signal Vge (V) provided from the control circuit 12 to the gate of the IGBT Q1, a load current Ic (A) flowing from the ignition transformer 4 to the IGBT Q1, the collector-to-emitter voltage Vice (V) of the IGBT Q1, and the ignition voltage V2 (V). The drive signal Vge (V) becomes the voltage (hereinafter referred to as "gate-to-emitter voltage") between the gate and the emitter of the IGBT Q1. The horizontal axis in FIG. 2 indicates a time T (sec).

At a time point t1, the signal level of the control signal Sd provided to the control circuit 12 is switched from the Low level to the Hi level, so that the signal level of the drive signal Vge provided to the gate of the IGBT Q1 is changed from the Low level to the Hi level. Consequently, the load current Ic begins to flow from the ignition transformer 4, which is the load, into the IGBT Q1. The load current Ic increases gradually.

At a time point t2 that is an ignition timing Tig, the signal level of the control signal Sd is switched from the Hi level to the Low level, so that the drive signal Vge is changed from the Hi level to the Low level. Consequently, the load current Ic is interrupted.

After that, at a time point t3, as at the time point t1, the signal level of the control signal Sd is switched from the Low level to the Hi level, so that the signal level of the drive signal Vge is changed from the Low level to the Hi level and the load current Ic begins to flow.

The value of the load current Ic varies depending on the ON time of the control signal Sd, in other words, the time during which the ON signal is provided as the control signal Sd, and a voltage Vp across the power source 9. When the load current Ic stands at a certain value or more, the IGBT Q1 is controlled to plateau the load current Ic in order to avoid the risk of blowouts of the winding of the primary coil 13 and the secondary coil 14 included in the ignition transformer 4 and the risk of magnetic saturation in the ignition transformer 4. The maximum allowable current value is defined as "current limit value" and is denoted by Ic0.

For example, at a time point t4, the signal level of the drive signal Vge falls from the Hi level, whereby the load current Ic further increases. At a time point t5, the load current Ic reaches the current limit value Ic0, so that the IGBT Q1 is controlled by the control circuit 12 such that the collector-to-emitter voltage Vice increases. Consequently, the load current Ic is limited to the current limit value Ic0.

After that, at a time point t6 that is the ignition timing Tig, the signal level of the control signal Sd is switched from the Hi level to the Low level, so that the drive signal Vge is changed from the Hi level to the Low level and the load current Ic is therefore interrupted.

At the operation point indicated by the reference sign "15," a large amount of Joule loss is produced in the IGBT Q1 that is the switching element.

FIG. 3 is a diagram showing a configuration of the control circuit 12 and the switching element part 3 of the semiconductor device 1 according to the underlying technique of the present invention. The control circuit 12 includes an internal power source 20, a Schmitt trigger circuit 21, a delay timer 22, a direct current source 23, a reference voltage source 24, a comparator 25, a voltage-current conversion circuit (V-I conversion circuit for short) 26, a first Schottky barrier diode Ds1, a second Schottky barrier diode Ds2, a control circuit Zener diode Zd2, a first resistor R1, a second resistor R2, a first P-channel metal-oxide semiconductor field-effect transistor (MOSFET) PM1, a second P-channel MOSFET PM2, a third P-channel MOSFET PM3, a fourth P-channel MOSFET PM4, and a fifth P-channel MOSFET PM5. The P-channel MOSFETs are hereinafter referred to as "PMOS transistors."

The switching element part 3 includes the IGBT Q1 and the Zener diode Zd1. The Zener diode Zd1 included in the switching element part 3 is hereinafter also referred to as "element-part Zener diode Zd1." The IGBT Q1 includes a sense terminal that outputs the sense current Isense in proportion to the collector current.

The cathode of the control circuit Zener diode Zd2 is connected with an output terminal G of the drive circuit 11. The anode of the control circuit Zener diode Zd2 is connected with a ground terminal GND of the power semiconductor ground 8. The anode of the first Schottky barrier diode Ds1 is connected with the output terminal G of the drive circuit 11. The cathode of the first Schottky barrier diode Ds1 is connected with the cathode of the second Schottky barrier diode Ds2. The anode of the second Schottky barrier diode Ds2 is connected with the ground terminal GND of the power semiconductor ground 8.

The junction between the cathode of the first Schottky barrier diode Ds1 and the cathode of the second Schottky barrier diode Ds2 is connected with the internal power source 20, one end of the first resistor R1, the input terminal of the Schmitt trigger circuit 21, the source of the first PMOS transistor PM1, the source of the second PMOS transistor PM2, the source of the third PMOS transistor PM3, the source of the fourth PMOS transistor PM4, and the source of the fifth PMOS transistor PM5.

The one end of the first resistor R1 is connected with the internal power source 20. The other end of the first resistor R1 is connected with the ground terminal GND of the power semiconductor ground 8.

The output terminal of the Schmitt trigger circuit 21 is connected with one end of the delay timer 22. The other end of the delay timer 22 is connected with the gate of the first PMOS transistor PM1. The drain of the first PMOS transistor PM1 is connected with the drain of the second PMOS transistor PM2 and the drain of the fourth PMOS transistor PM4.

The junction of the drain of the first PMOS transistor PM1, the drain of the second PMOS transistor PM2, and the drain of the fourth PMOS transistor PM4 is connected with one end of the direct current source 23. The other end of the direct current source 23 is connected to the ground terminal GND of the power semiconductor ground 8.

The second PMOS transistor PM2 and the third PMOS transistor PM3 form a current mirror circuit. The gate of the second PMOS transistor PM2 and the gate of the third PMOS transistor PM3 are connected in common to be connected with the drain of the third PMOS transistor PM3. The drain of the third PMOS transistor PM3 is connected with the output terminal of the V-I conversion circuit 26.

The fourth PMOS transistor PM4 and the fifth PMOS transistor PM5 form a current mirror circuit. The gate of the fourth PMOS transistor PM4 and the gate of the fifth PMOS transistor PM5 are connected in common to be connected with the drain of the fourth PMOS transistor PM4.

The drain of the fifth PMOS transistor PM5 is connected with one end of the second resistor R2. The other end of the second resistor R2 is connected with the ground terminal GND of the power semiconductor ground 8. The junction between the drain of the fifth PMOS transistor PM5 and the one end of the second resistor R2 is connected with the junction between the anode of the element-part Zener diode Zd1 and the gate of the IGBT Q1 included in the switching element part 3.

The collector of the IGBT Q1 is connected with one end of the primary coil 13 of the ignition transformer 4 shown in FIG. 1 and is also connected with the cathode of the element-part Zener diode Zd1. The anode of the element-part Zener diode Zd1 is connected with the gate of the IGBT Q1.

The emitter of the IGBT Q1 is connected with the ground terminal GND of the power semiconductor ground 8. The sense terminal of the IGBT Q1 is connected with one end of the current detection resistor Rs1. The other end of the current detection resistor Rs1 is connected with the emitter of the IGBT Q1 and the ground terminal GND of the power semiconductor ground 8.

FIG. 1 described above shows the case in which the current detection resistor Rs1 is located between the emitter of the IGBT Q1 and the power semiconductor ground 8. For easy understanding, FIG. 3 shows the case in which the sense terminal located in the emitter of the IGBT Q1 is connected with the ground terminal GND of the power semiconductor ground 8 through the current detection resistor Rs1 and the emitter of the IGBT Q1 is connected with the ground terminal GND of the power semiconductor ground 8.

The junction between the sense terminal of the IGBT Q1 and the one end of the current detection resistor Rs1 is connected with the noninverting terminal of the comparator 25. The inverting input terminal of the comparator 25 is connected with the positive terminal of the reference voltage source 24. The negative terminal of the reference voltage source 24 is connected with the reference supply potential GND. The output terminal of the comparator 25 is connected with the input terminal of the V-I conversion circuit 26.

As for the control circuit 12 according to the underlying technique, while the signal level of the output signal output from the drive circuit 11 is the Low level, the electric potential of the power semiconductor ground 8 shown in FIG. 1 may decrease to about −60 V due to the application of, for example, surge under the influence of the wiring extended to the battery GND to which the battery is connected. This may cause the semiconductor device 1 to malfunction and perform the ON operation again after the IGBT Q1 is turned off.

To prevent this, the semiconductor device 1 has, as the protection function, the function of preventing unnecessary ignition operation so as not to operate in response to a short-pulse signal such as a surge. The semiconductor device 1 is equipped with other protection functions including the function of interrupting the load current in order to avoid a breakdown caused by burnout in a case where the ON signal is continuously applied for a predetermined time or more.

These protection functions lead to an increase in the circuit size of the semiconductor device 1, hindering the cost reduction and the miniaturization. Thus, the configurations in the embodiments described below are adopted to the semiconductor device according to the present invention.

Figure 4:
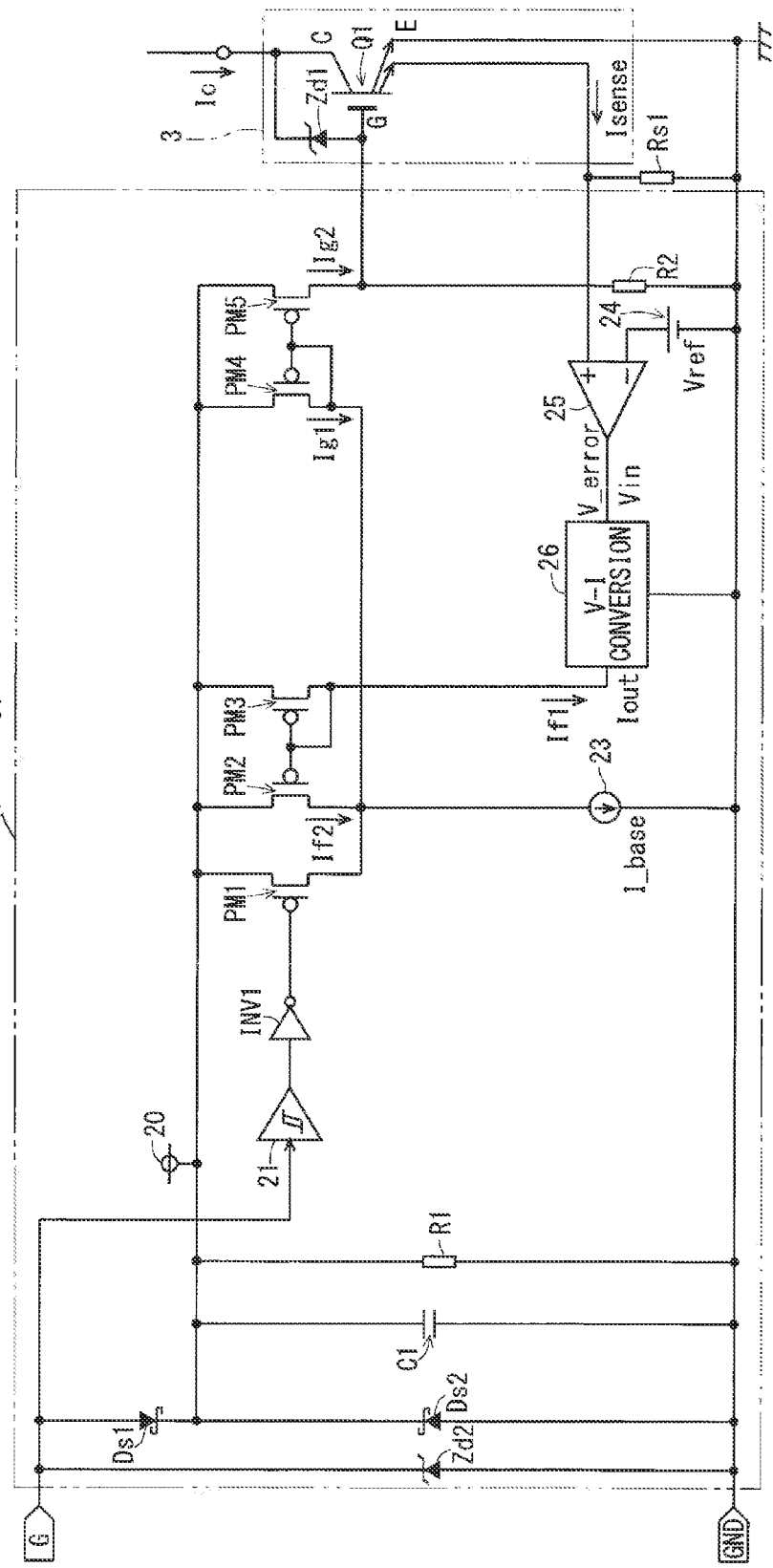
FIG. 4 A diagram showing a configuration of a control circuit 31 and the switching element part 3 of a semiconductor device 30 according to a first embodiment of the present invention.

FIG. 4 is a diagram showing a configuration of a control circuit 31 and the switching element part 3 of a semiconductor device 30 according to a first embodiment of the present invention. The semiconductor device 30 is, in place of the semiconductor device 1 shown in FIG. 1 described above, included in the ignition device 10.

The semiconductor device 30 according to the present embodiment is configured similarly to the semiconductor device 1 shown in FIG. 1 except that the semiconductor device 30 includes the control circuit 31 shown in FIG. 4 in place of the control circuit 12 according to the underlying technique shown in FIG. 3. The control circuit 31 of the semiconductor device 30 according to the present embodiment has the same configuration as that of the control circuit 12 according to the underlying technique except that the control circuit 31 includes an external capacitor C1 and a first inverter circuit INV1 in place of the delay timer 22 shown in FIG. 3. Thus, the same reference signs indicate the same constituent components of the control circuit 12, and a description applied in common is omitted.

According to the present embodiment, the input terminal of the Schmitt trigger circuit 21 is connected with the junction between the anode of the first Schottky barrier diode Ds1 and the output terminal G of the drive circuit 11. The input terminal of the Schmitt trigger circuit 21 is not connected with the junction between the cathode of the first Schottky barrier diode Ds1 and the cathode of the second Schottky barrier diode Ds2.

The output terminal of the Schmitt trigger circuit 21 is connected with the input terminal of the first inverter circuit INV1. The output terminal of the first inverter circuit INV1 is connected with the gate of the first PMOS transistor PM1.

The external capacitor C1 is located outside the semiconductor chip forming the remainder of the control circuit 31 apart from the external capacitor C1. One electrode of the external capacitor C1 is connected with the internal power source 20. The other electrode of the external capacitor C1 is connected with the ground terminal GND of the power semiconductor ground 8.

The control circuit 31 according to the present embodiment is the switching element drive circuit of the negative logic type utilizing electric charges stored in the external capacitor C1. The control circuit 31 is formed of a complementary metal oxide semiconductor (CMOS for short). Thus, the capacity of the external capacitor C1 can be made relatively smaller owing to the relatively small consumption current of the control circuit 31.

When the control signal output and input from the output terminal G of the drive circuit 11 is in the Hi level, the control circuit 31 charges the external capacitor C1. When the control signal output and input from the output terminal G of the drive circuit 11 is in the Low level, the control circuit 31 drives the IGBT Q1, which is the switching element, through the use of the electric charges stored in the external capacitor C1.

According to the present embodiment, the first Schottky barrier diode Ds1 is connected with the external capacitor C1 to prevent electric charges in the external capacitor C1 from flowing backward to the output terminal G of the drive circuit 11 that is the input side while the control signal is in the Low level.

The control circuit 31 drives the IGBT Q1 through the use of electric charges stored in the external capacitor C1, and therefore, inevitably stops operating when the electric charges stored in the external capacitor C1 run out. Thus, the control circuit 31 according to the present embodiment can easily provide the function of interrupting the load current Ic in a case where the ON signal is continuously applied for a predetermined time or more.

In particular, according to the present embodiment, at the time of occurrence of abnormal continuous energization in which the circuit is energized continuously for a long period of time (hereinafter also referred to as "under the abnormal continuous energization"), electricity is discharged from the external capacitor C1 through power consumption by the control circuit 31. Along with the discharging of electricity from the external capacitor C1, the drive signal Vge that is the gate-to-emitter voltage across the IGBT Q1 decreases gradually, so that the control circuit 31 can slowly interrupt the collector current Ic that is the load current.

The control circuit 12 according to the underlying technique shown in FIG. 3 described above requires a protection circuit that detects the abnormal continuous energization and slowly interrupts the collector current Ic that is the load current. Meanwhile, the control circuit 31 according to the present embodiment can slowly interrupt the load current Ic through the discharging of electricity from the external capacitor C1 as described above, eliminating the need for including an additional protection circuit.

Thus, without including an additional protection circuit, the control circuit 31 according to the present embodiment can easily handle both the timer function of preventing the circuit from being continuously energized for a long period of time (hereinafter also referred to as "timer function of preventing continuous energization") and the function of slowly interrupting the collector current Ic that is the load current (hereinafter also referred to as "function of slowly interrupting current). This allows for the miniaturization and the cost reduction of the control circuit 31.

As for the control circuit 12 according to the underlying technique shown in FIG. 3, when the control signal output from the drive circuit 11 is the OFF signal and the IGBT Q1 is therefore turned off, the voltage across the ground terminal GND of the power semiconductor ground 8 may, in the presence of, for example, surge and noise, decrease to about −60 V due to wiring drops, and accordingly, the IGBT Q1 may perform the ON operation again.

Meanwhile, the control circuit 31 according to the present embodiment, which is of the negative logic type, is capable of preventing the IGBT Q1 from performing the ON operation again. For the negative logic type, in particular, while the IGBT Q1 is turned off, the signal level of the output signal output from the drive circuit 11 is the Hi level, placing the external capacitor C1 in the charging mode. In this state, the control circuit 31 does not operate even if the voltage across the ground terminal GND of the power semiconductor ground 8 decreases to about −60 V. This can prevent the IGBT Q1 from performing the ON operation again.

The control circuit 12 according to the underlying technique described above cannot drive the PMOS transistors including the first to fifth PMOS transistors PM1 to PM5 and NMOS transistors if the signal level of the output signal output from the drive circuit 11 is the Low level.

As for the control circuit 31 according to the present embodiment, meanwhile, even if the signal level of the output signal output from the drive circuit 11 is the Low level, electric charges are stored in the external capacitor C1, and accordingly, the control circuit 31 can be supplied with power. This allows for the driving of the PMOS transistors including the first to fifth PMOS transistors PM1 to PM5 and the NMOS transistors.

For example, a ceramic capacitor having a relatively high permittivity is used as the external capacitor C1. The external capacitor C1 is located outside the semiconductor chip forming the remainder of the control circuit 31 apart from the external capacitor C1, so that the control circuit 31 can be provided at a relatively low cost. Moreover, the capacity of the external capacitor C1 can be designed freely.

Figure 5:
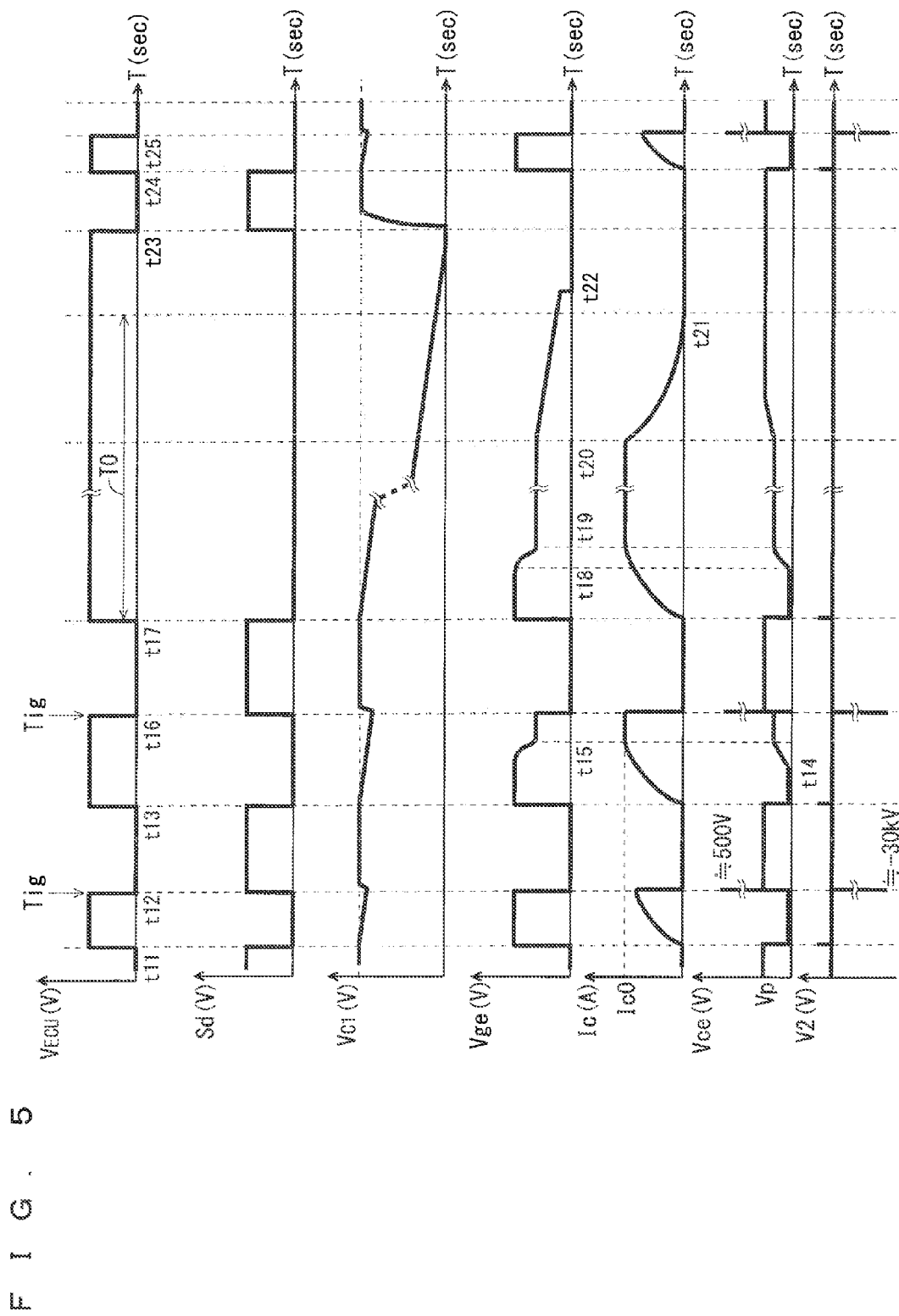
FIG. 5 A timing chart showing an operation of the control circuit 31 and the switching element part 3 in FIG. 4.

FIG. 5 is a timing chart showing an operation of the control circuit 31 and the switching element part 3 in FIG. 4. To show the operation of the semiconductor device 30, FIG. 5 provides the timing chart illustrating the changes in a voltage signal $V_{ECU}$ (V) input from the ECU 6 to drive circuit 11, the control signal Sd (V) provided from the drive circuit 11 to the control circuit 31, an inter-terminal voltage $V_{c1}$ (V) across the external capacitor C1, the drive signal Vge (V) provided from the control circuit 31 to the gate of the IGBT Q1, the load current Ic (A) flowing from the ignition transformer 4 into the IGBT Q1, the collector-to-emitter voltage Vice (V) of the IGBT Q1, and the ignition voltage V2 (V). The horizontal axis in FIG. 5 indicates the time T (sec).

At a time point t11, the ON signal for turning on the IGBT Q1 that is the switching element, is applied, as the voltage signal $V_{ECU}$, from the ECU 6 shown in FIG. 1. In particular, the signal level of the voltage signal $V_{ECU}$ input from the ECU 6 to the drive circuit 11 is switched from the Low level to the Hi level.

Consequently, at the time point t11, the signal level of the control signal Sd provided from the drive circuit 11 to the control circuit 31 is changed from the Hi level to the Low level. At the time point t11, the external capacitor C1 starts discharging electricity, whereby the inter-terminal voltage $V_{c1}$ across the external capacitor C1 begins to decrease. At the time point t11, the signal level of the drive signal Vge, which is the gate-to-emitter voltage across the IGBT Q1, is changed from the Low level to the Hi level, whereby the IGBT Q1 turns on.

The IGBT Q1 turns on at the time point t11, so that the load current Ic begins to flow into the IGBT Q1 as shown in FIG. 5 in accordance with the time constant that depends on the inductance of the ignition transformer 4 that is the load and on the wiring resistance. The load current Ic gradually increases.

At the ignition timing Tig that is the desired timing in igniting the fuel, for example, at a time point t12, the signal level of the control signal output from the ECU 6, particularly, the voltage signal $V_{ECU}$ input from the ECU 6 to the drive circuit 11 is switched from the Hi level to the Low level, so that the OFF signal for turning off the IGBT Q1 is applied from the drive circuit 11 onto the control circuit 31 as the control signal Sd. That is, the signal level of the control signal Sd is changed from the Low level to the Hi level.

Consequently, at the time point t12, the signal level of the drive signal Vge that is the gate-to-emitter voltage across the IGBT Q1 is changed from the Hi level to the Low level, interrupting the load current Ic flowing through the primary coil 13 of the ignition transformer 4. At the time point t12, the external capacitor C1 starts charging, whereby the inter-terminal voltage $V_{c1}$ across the external capacitor C1 begins to increase.

The interruption of the load current Ic induces changes in flux linkage in the ignition transformer 4, so that a high voltage that depends on the ratio of the number of turns is induced in the secondary coil 14. This causes the electric discharge of the spark plug in the engine cylinder.

Then, at a time point t13, as at the time point t11, the signal level of the voltage signal $V_{ECU}$ input from the ECU 6 to the drive circuit 11 is switched from the Low level to the Hi level, whereby the signal level of the control signal Sd provided from the drive circuit 11 to the control circuit 31 is changed from the Hi level to the Low level. At the time point t13, the external capacitor C1 starts discharging electricity, whereby the inter-terminal voltage $V_{c1}$ across the external capacitor C1 begins to decrease. At the time point t13, the signal level of the drive signal Vge that is the gate-to-emitter voltage across the IGBT Q1 is changed from the Low level to the Hi level, whereby the IGBT Q1 turns on.

The IGBT Q1 turns on at the time point t13, so that the load current Ic begins to flow into the IGBT Q1. The load current Ic gradually increases.

The control circuit 31 has the current limiting function in order to regulate blowouts of the winding caused by an overcurrent, to regulate demagnetization of the magnet for adjusting the magnetic resistance that is the reluctance of the ignition transformer 4, and to regulate magnetic saturation of the core material. The current limiting function is the protection function that prevents the flow of the load current Ic equal to or more than a predetermined value. The predetermined value is the "current limit value" described above. In the description below, the current limit value is denoted by Ic0. The current limit value stands at, for example, 10 A or 14 A.

In the control circuit 31, the signal level of the drive signal Vge that is the gate-to-emitter voltage across the IGBT Q1 drops from the Hi level, further increasing the load current Ic. At a time point t15, the load current Ic flowing into the IGBT Q1 reaches the current limit value Ic0, so that the IGBT Q1 is controlled to prevent the flow of the load current Ic equal to or more than the current limit value Ic0. Such control is hereinafter also referred to as "negative feedback control." While the negative feedback control is performed, in other words, from the time point t15 to a time point t16, the signal level of the drive signal Vge that is the gate-to-emitter voltage across the IGBT Q1 is lower than the Hi level.

In limiting the current, the control circuit 31 causes the comparator 25 to amplify the sense voltage Vsense by comparing it with a reference voltage Vref and causes the V-I conversion circuit 26 to convert the manipulated variable output from the output terminal of the comparator 25 into a current amount If1. The sense voltage Vsense is the voltage generated by the sense current Isense and the current detection resistor Rs1 that is a sense resistor shown in FIG. 4.

Owing to the current amount If1 that has been obtained, a drain current If2 is generated from the drain of the second PMOS transistor PM2 and flows into a current I_base flowing through the direct current source 23. This causes variations in a current generation amount Ig2 that is the amount of the current I_base flowing through the direct current source 23. The direct current source 23 is the current source that drives the IGBT Q1.

The current generation amount Ig2 decreases with increasing collector current Ic that is the load current, whereby the voltage generated by the second resistor R2 decreases, which works to regulate the collector current IC that is the load current. This provides the negative feedback control. The resistance value of the second resistor R2 is the order of several 10 kΩ. In the example shown in FIG. 5, the operation described above is performed through the use of electric charges stored in the external capacitor C1.

The external capacitor C1 is charged and discharged in accordance with the output signal output from the drive circuit 11 in concert with the Hi level or the Low level of the output signal output from the ECU 6. For example, when the signal level of the output signal output from the drive circuit 11 is the Hi level, the control circuit 31 charges the external capacitor C1 and stops the circuit operation, in other words, turns off the IGBT Q1 by setting the gate signal of the IGBT Q1 to the Low level. When the signal level of the output signal output from the device circuit 11 is the Low level, the control circuit 31 starts the circuit operation using electric charges stored in the external capacitor C1, in other words, turns on the IGBT Q1 by setting the gate signal of the IGBT Q1 to the Hi level.

After that, at the time point t16 that is the ignition timing Tig, the signal level of the voltage signal $V_{ECU}$ input from the ECU 6 to the drive circuit 11 is switched from the Hi level to the Low level, so that the drive circuit 11, the OFF signal for turning off the IGBT Q1 is applied from the drive circuit 11 onto the control circuit 31 as the control signal Sd. That is, the signal level of the control signal Sd is changed from the Low level to the Hi level. Consequently, at the time point t16, the signal level of the drive signal Vge that is the gate-to-emitter voltage across the IGBT Q1 becomes the Low level, whereby the load current Ic flowing through the primary coil 13 of the ignition transformer 4 is interrupted.

Assume that the abnormal continuous energization occurs for a period afterward, for example, a period TO from a time point t17 to a time point t21. At the time point t17, as at the time points t11 and t13, the signal level of the voltage signal $V_{ECU}$ input from the ECU 6 to the drive circuit 11 is switched from the Low level to the Hi level and the signal level of the control signal Sd provided from the drive circuit 11 to the control circuit 31 is changed from the Hi level to the Low level. At the time point t17, the external capacitor C1 starts discharging electricity, whereby the inter-terminal voltage $V_{c1}$ across the external capacitor C1 begins to decrease. At the time point t17, the signal level of the drive signal Vge that is the gate-to-emitter voltage across the IGBT Q1 is changed from the Low level to the Hi level, whereby the IGBT Q1 turns on.

The IGBT Q1 turns on at the time point t17, so that the load current Ic begins to flow into the IGBT Q1. The load current Ic gradually increases. At the time point t18, the signal level of the drive signal Vge drops from the Hi level, further increasing the load current Ic. At the time point t19, the load current Ic reaches the current limit value Ic0, so that the IGBT Q1 is controlled by the control circuit 31 such that the collector-to-emitter voltage Vice increases.

Upon the abnormal continuous energization resulting from the continuous energization of the load current Ic at the current limit value Ic0 for a relatively long period of time, electricity is discharged from the external capacitor C1 through power consumption by the control circuit 31. Along with the discharging of electricity from the external capacitor C1, the signal level of the drive signal Vge that is the gate-to-emitter voltage across the IGBT Q1 starts to decrease, for example, at the time point t20. Along with the decrease, the load current Ic starts to decrease and the load current Ic becomes zero, for example, at the time point t21.

For the period TO from the time point t17 to the time point t21, the external capacitor C1 continues discharging electricity, whereby the inter-terminal voltage $V_{C1}$ across the external capacitor C1 gradually decreases. Along with the decrease, the signal level of the drive signal Vge gradually decreases and the drive signal Vge falls to the Low level, for example, at a time point t22. After that, for example, prior to a time point t23, the discharging of electricity from the external capacitor C1 is completed, whereby the inter-terminal voltage $V_{c1}$ across the external capacitor C1 becomes zero.

Under conditions where electricity is discharged from the external capacitor C1 as described above, the signal level of the voltage signal $V_{ECU}$ input from the ECU 6 to the drive circuit 11 is switched from the Hi level to the Low level, for example, at the time point t23. Along with this, the OFF signal for turning off the IGBT Q1 is applied from the drive circuit 11 onto the control circuit 31 as the control signal Sd. That is, the signal level of the control signal Sd is changed from the Low level to the Hi level. This starts the charging of the external capacitor C1.

After the completion of the charging of the external capacitor C1, the operation returns to normal and the operation is performed similarly to that for the period from the time point t11 to the time point t12 and the period from the time point t13 to the time point t16.

For example, at a time point t24, the signal level of the voltage signal $V_{ECU}$ input from the ECU 6 to the drive circuit 11 is switched form the Low level to the Hi level and the signal level of the control signal Sd is changed from the Hi level to the Low level. This causes the external capacitor C1 to start discharging electricity, so that the signal level of the drive signal Vge is changed from the Low level to the Hi level, and thus, the IGBT Q1 turns on.

Subsequently, for example, at a time point t25, the signal level of the voltage signal $V_{ECU}$ input from the ECU 6 to the drive circuit 11 is switched from the Hi level to the Low level and the signal level of the control signal Sd is changed from the Low level to the Hi level, so that the signal level of the drive signal Vge is changed from the Hi level to the Low level, interrupting the load current Ic flowing through the primary coil 13 of the ignition transformer 4.

After the time point t25, the normal operation is repeatedly performed as in the period from the time point t11 to the time point t12, the period from the time point t13 to the time point t16, and the period from the time point t24 to the time point t25. Under the abnormal continuous energization, the operation is performed as in the period TO from the time point t11 to the time point t21.

Under the abnormal continuous energization, in which energization is continued for, for example, about 100 msec or more to about 200 msec or less, electricity is discharged from the external capacitor C1 through power consumption by the control circuit 31. Along with the discharging form the external capacitor C1, the gate-to-emitter voltage Vge of the IGBT Q1 gradually decreases, whereby the collector current Ic that is the load current can be slowly interrupted.

Thus, the present embodiment eliminates the need for the protection circuit, which has been required in the control circuit 12 according to the underlying technique shown in FIG. 3 described above, for detecting the abnormal energization and slowly interrupting the collector current Ic. Consequently, both the timer function of preventing continuous energization and the function of slowly interrupting current can be easily handled, which allows for the miniaturization and the cost reduction of the integrated circuit 2 including the control circuit 31.

As for the control circuit 12 according to the underlying technique, while the signal level of the output signal output from the drive circuit 11 is the Low level and the gate signal of the IGBT Q1 is in the Low level, the electric potential of the ground terminal GND of the power semiconductor ground 8 may swing to negative due to wring drops, and thus, the IGBT Q1 that is the switching element may turn on again. Therefore, the control circuit 12 according to the underlying technique is equipped with the re-turning on preventing circuit for preventing the IGBT Q1, which is the switching element, from turning on again.

For example, the potential of the ground terminal GND of the power semiconductor ground 8 may decease to about −60 V due to the occurrence of, for example, surge and noise under the influence of the routing of the wiring from the battery GND. In the control circuit 12 according to the underlying technique, while the gate signal of the IGBT Q1 is OFF, the signal level of the output signal output from the drive circuit 11 is the Low level. In this state, the decrease in the power GND to about −60 V causes IGBT Q1 to perform the ON operation.

Meanwhile, in the control circuit 31 according to the present embodiment, while the gate signal of the IGBT Q1 is OFF, the swinging of the potential of the power GND to negative only results in the charging of the external capacitor C1. Consequently, the IGBT Q1 is not driven and the IGBT Q1 can be thus prevented from turning on again.

In particular, as for the control circuit 31 according to the present embodiment, while the gate signal is OFF, the signal level of the output signal output from the drive circuit 11 is the Hi level. In this state, the decrease in the electric potential of the power GND to about −60 V only produces the higher electric potential, in other words, the Hi level of the output signal output from the drive circuit 11, and thus, the fact remains that the external capacitor C1 is charged. Consequently, the IGBT Q1 that is the switching element is not driven.

As described above, the present embodiment provides the control circuit 31 that is not equipped with the re-turning on preventing circuit but has the protection function equivalent to that of the control circuit 12 according to the underlying technique. Therefore, the present embodiment allows for the miniaturization and the cost reduction of the integrated circuit including the control circuit 31.

Second Embodiment

Figure 6:
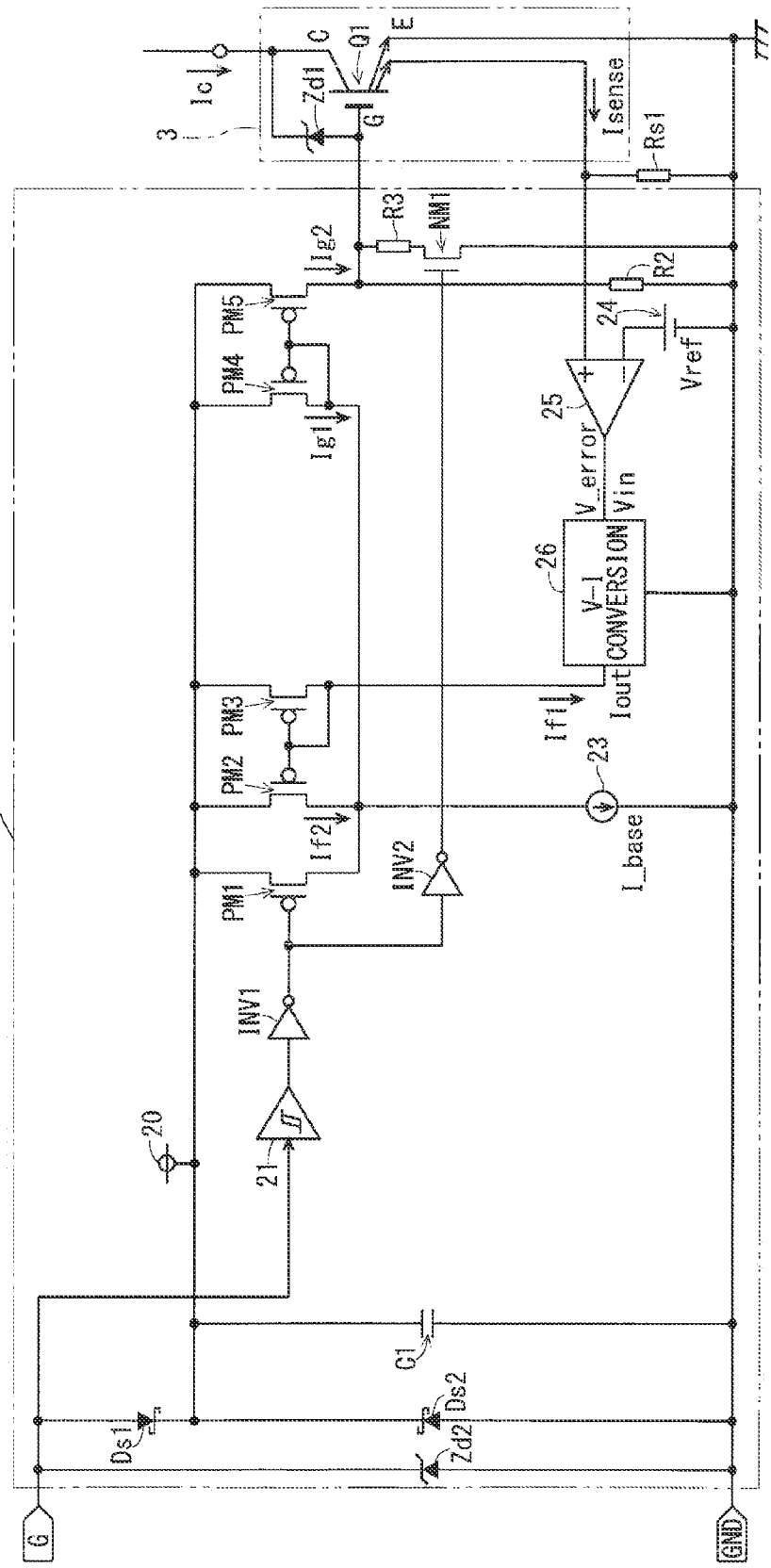
FIG. 6 A diagram showing a configuration of a control circuit 36 and the switching element part 3 of a semiconductor device 35 according to a second embodiment of the present invention.

FIG. 6 is a diagram showing a configuration of a control circuit 36 and the switching element part 3 of a semiconductor device 35 according to a second embodiment of the present invention. The semiconductor device 35 is, in place of the semiconductor device 1 shown in FIG. 1 described above, included in the ignition device 10. The semiconductor device 35 according to the present embodiment has the same configuration as that of the semiconductor device 30 according to the first embodiment shown in FIG. 4 described above except for the configuration described below. The configuration of the control circuit 36 according to the present embodiment is similar to the configuration of the control circuit 31 according to the first embodiment. Thus, the same reference signs indicate the same constituent components of the control circuit 31, and a description applied in common is omitted.

The first resistor R1 is connected with the control circuit 31 according to the first embodiment shown in FIG. 4 in order to adjust the interruption speed for the collector current Ic. The gate capacitance of the IGBT Q1 that is the switching element is discharged in accordance with the impedance that depends on the first resistor R1 and the second resistor R2, whereby the interruption speed is determined. In this case, variations are produced and a consumption current is generated at the first resistor R1 not only at the time of interruption of the collector current Ic but all the times.

According to the present embodiment, a third resistor R3, a first N-channel MOSFET NM1, and a second inverter circuit INV2 are, in place of the first resistor R1, located between the gate and the emitter of the IGBT Q1. The N-channel MOSFTs are hereinafter referred to as "NMOS transistors."

According to the present embodiment, the output terminal of the first inverter circuit INV1 is connected with the input terminal of the second inverter circuit INV2 and the gate of the first PMOS transistor PM1. The output terminal of the second inverter circuit INV2 is connected with the gate of the first NMOS transistor NM1. The drain of the first NMOS transistor NM1 is connected with the other end of the third resistor R3. The source of the first NMOS transistor NM1 is connected with the ground terminal GND of the power semiconductor ground 8. One end of the third resistor R3 is connected with the drain of the fifth PMOS transistor PM5, the anode of the element-part Zener diode Zd1, and the gate of the IGBT Q1.

According to the present embodiment, the first NMOS transistor NM1 is turned on when the collector current Ic is interrupted. Consequently, the interruption speed for the collector current Ic is determined in accordance with the impedance that depends on the second and third resistors R2 and R3.

According to the present embodiment as described above, the third resistor R3 is connected directly to the gate of the IGBT Q1 as the discharge resistor. This configuration provides a discharge impedance adjustment circuit that adjusts the discharge impedance from the IGBT Q1 that is the switching element.

Thus, the discharge impedance adjustment circuit is provided by connecting the third resistor R3 directly to the gate of the IGBT Q1 as the discharge resistor, to thereby regulate variations and control the interruption speed for the collector current Ic. At a time other than the time of interruption of the collector current Ic, the first NMOS transistor NM1 is turned off, to thereby avoid the generation of consumption current at the third resistor R3.

Third Embodiment

Figure 7:
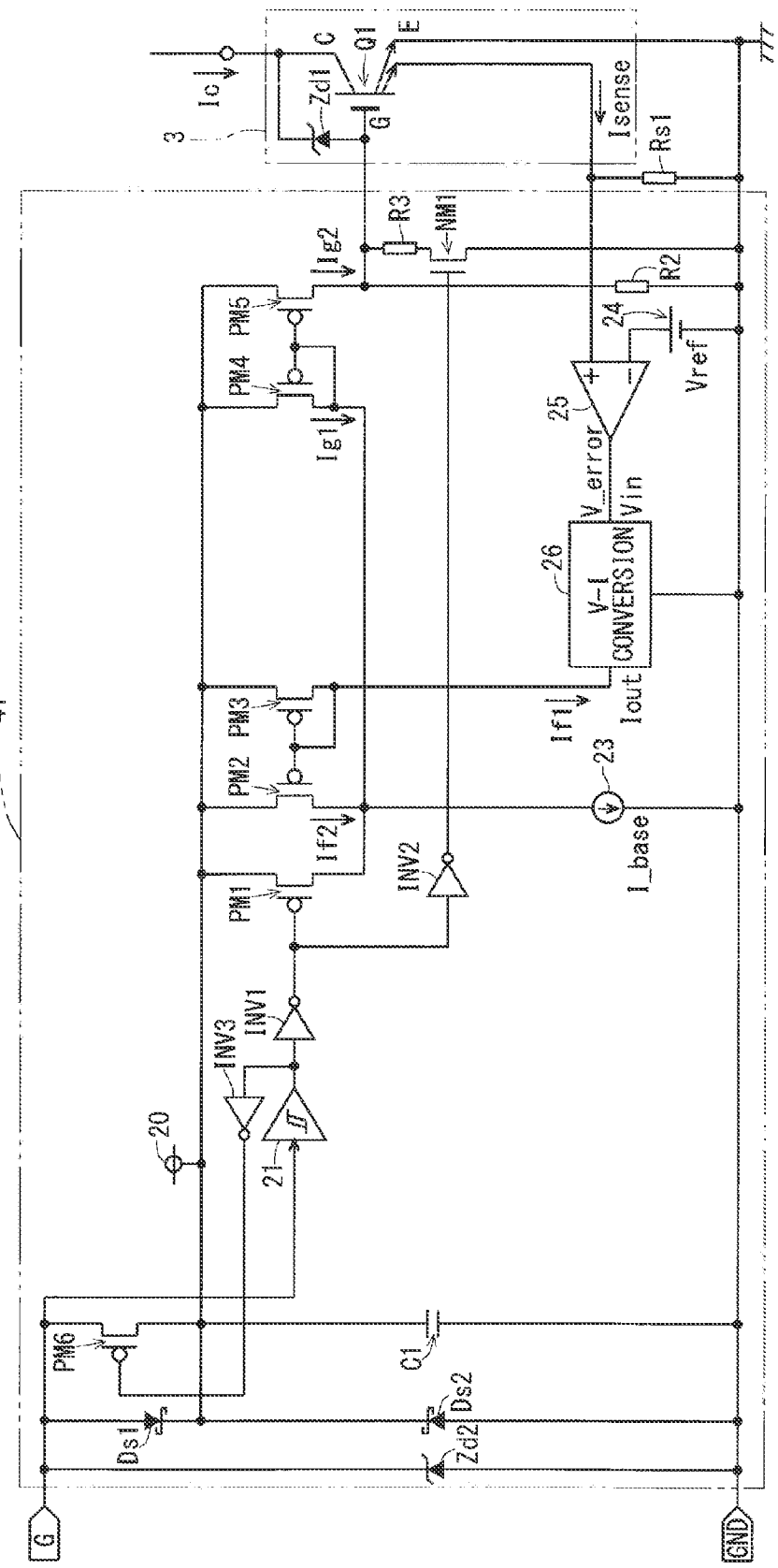
FIG. 7 A diagram showing a configuration of a control circuit 41 and the switching element part 3 of a semiconductor device 40 according to a third embodiment of the present invention.

FIG. 7 is a diagram showing a configuration of a control circuit 41 and the switching element part 3 of a semiconductor device 40 according to a third embodiment of the present invention. The semiconductor device 40 is, in place of the semiconductor device 1 shown in FIG. 1 described above, included in the ignition device 10. The semiconductor device 40 according to the present embodiment has the same configuration as that of the semiconductor device 35 according to the second embodiment shown in FIG. 6 described above except for the configuration described below. The configuration of the control circuit 41 according to the present embodiment is similar to the configuration of the control circuit 36 according to the second embodiment. Thus, the same reference signs indicate the same constituent components of the control circuit 36, and a description applied in common is omitted.

As for the control circuits 31 and 36 according to the first and second embodiments, while the battery voltage is low, the charging voltage across the external capacitor C1 is reduced due to the forward drop voltage across the first Schottky barrier diode Ds1 that is the electric-charge-backflow-preventing Schottky barrier diode, possibly resulting in a decrease in the capability for interrupting the collector current Ic. In particular, the Schottky barrier diode Ds1 has a higher forward voltage VF at a low temperature, possibly providing a noticeable decrease in the capability for interrupting the collector current Ic.

The control circuit 41 according to the present embodiment includes a sixth PMOS transistor PM6 and a third inverter circuit INV3 to bypass the first Schottky barrier diode Ds1. The source of the sixth PMOS transistor PM6 is connected with the anode of the first Schottky barrier diode Ds1 and the input terminal of the Schmitt trigger circuit 21. The output terminal of the Schmitt trigger circuit 21 is connected with the input terminal of the first inverter circuit INV1 and the input terminal of the third inverter circuit INV3. The output terminal of the third inverter circuit INV3 is connected with the gate of the sixth PMOS transistor PM6. The drain of the sixth PMOS transistor PM6 is connected with the cathode of the first Schottky barrier diode Ds1, the internal power source 20, and the one electrode of the external capacitor C1.

Thus, according to present embodiment, a field-effect transistor, in particular, the sixth PMOS transistor PM6 is located between the anode and the cathode of the first Schottky barrier diode Ds1 that is the electric-charge-back-flow-preventing Schottky barrier diode. The first Schottky barrier diode Ds1 is bypassed through the PMOS transistor as described above, which can reduce the voltage drop across the first Schottky barrier diode Ds1. Consequently, the capability for interrupting the collector current Ic can be significantly improved.

Fourth Embodiment

Figure 8:
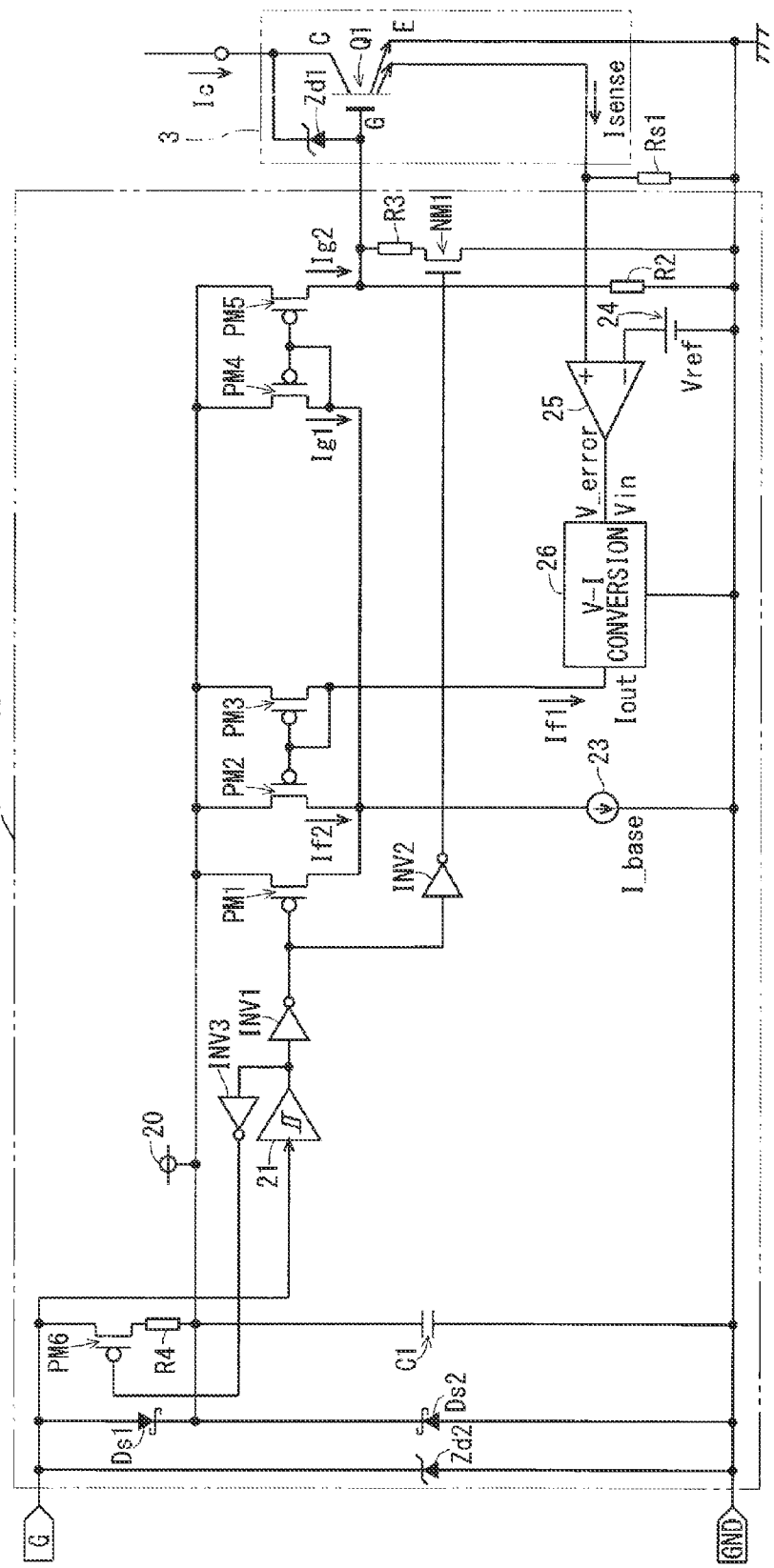
FIG. 8 A diagram showing a configuration of a control circuit 46 and the switching element part 3 of a semiconductor device 45 according to a fourth embodiment of the present invention.

FIG. 8 is a diagram showing a configuration of a control circuit 46 and the switching element part 3 of a semiconductor device 45 according to a fourth embodiment of the present invention. The semiconductor device 45 is, in place of the semiconductor device 1 shown in FIG. 1 described above, included in the ignition device 10. The semiconductor device 45 according to the present embodiment has the same configuration as that of the semiconductor device 40 according to the third embodiment shown in FIG. 7 described above except for the configuration described below. The configuration of the control circuit 46 according to the present embodiment is similar to the configuration of the control circuit 41 according to the third embodiment. Thus, the same reference signs indicate the same constituent components of the control circuit 41, and a description applied in common is omitted.

As for the control circuit 31, 36, and 41 according to the first to third embodiments, there is a potential of discharging electric charges in the external capacitor C1 through the sixth PMOS transistor PM6 when the output signal output from the drive circuit 11 is switched from ON to OFF.

According to the present embodiment, a fourth resistor R4 is connected between the external capacitor C1 and the drain of the sixth PMOS transistor PM6. This configuration provides an electric discharge regulating circuit that regulates the discharge of electric charges stored in the external capacitor C1 when the signal output from the drive circuit 11 is switched from the Hi level to the Low level, to thereby provide a time constant.

This configuration can regulate the electric discharge during the transmission delay interval before the sixth PMOS transistor PM6 turns off.

Fifth Embodiment

FIG. 9 is a diagram showing a configuration of a control circuit 51 and the switching element part 3 of a semiconductor device 50 according to a fifth embodiment of the present invention. The semiconductor device 50 is, in place of the semiconductor device 1 shown in FIG. 1 described above, included in the ignition device 10. The semiconductor device 50 according to the present embodiment has the same configuration as that of the semiconductor device 45 according to the fourth embodiment shown in FIG. 8 described above except for the configuration described below. The configuration of the control circuit 51 according to the present embodiment is similar to the configuration of the control circuit 46 according to the fourth embodiment. Thus, the same reference signs indicate the same constituent components of the control circuit 46, and a description applied in common is omitted.

Besides the constituent components of the control circuit 46 according to the fourth embodiment, the control circuit 51 according to the present embodiment includes a fifth resistor R5, a second NMOS transistor NM2, and a current detection circuit 52 that is the integrated circuit capable of detecting a current flowing through the IGBT Q1 that is the switching element.

One end of the fifth resistor R5 is connected with the internal power source 20. The other end of the fifth resistor R5 is connected with the drain of the second NMOS transistor NM2. The source of the second NMOS transistor NM2 is connected the ground terminal GND of the power semiconductor ground 8. The input terminal of the current detection circuit 52 is connected with one end of the current detection resistor Rs1. The output terminal of the current detection circuit 52 is connected with the gate of the second NMOS transistor NM2.

In a case where a current flowing through the IGBT Q1, in other words, the collector current Ic that is the load current exceeds the predetermined current value, the current detection circuit 52 outputs a Hi-level signal of 1 pulse to the gate of the second NMOS transistor NM2.

When an overcurrent flows, the voltage drop across the current detection resistor Rs1 increases. Thus, the current detection circuit 52 determines whether an overcurrent has occurred by detecting the voltage drop across the current detection resistor Rs1. When the current detection circuit 52 determines the occurrence of overcurrent, it outputs a Hi-level signal of 1 pulse to the gate of the second NMOS transistor NM2 as described above, thereby turning on the second NMOS transistor NM2. Consequently, a current that depends on the fifth resistor R5 flows, which increases the consumption current in the control circuit 51. The circuit formed by the second NMOS transistor NM2 and the fifth resistor R5 is equivalent to the circuit that increases the consumption current in the control circuit 51.

The consumption current in the control circuit 51 is monitored through, for example, the drive circuit 11, so that the information (hereinafter also referred to as "overcurrent information") indicating the occurrence of overcurrent can be transmitted from the drive circuit 11 to the ECU 6 that is the control computer. Consequently, the ECU 6 can control the integrated circuit 2 to turn off the IGBT Q1, to thereby avoid the risk of burnout caused by an overcurrent. This can improve the durability and the reliability of the engine system as a whole.

According to the configuration of the control circuit 51 of the present embodiment, an overcurrent can be detected while the signal level of the output signal output from the drive circuit 11 is the Hi level, in other words, the IGBT Q1 that is the switching element is OFF.

The signal output from the current detection circuit 52 to the second NMOS transistor NM2 is not limited to the Hi-level signal of 1 pulse, and may be a signal that has been subjected to the pulse width modulation (PWM for short) applied in accordance with the current level. The signal may be modulated by a modulation technique other than the pulse width modulation. The signal modulated by any one of the modulation techniques can produce the same effect as that in a case where the Hi-level signal of 1 pulse is used.

Sixth Embodiment

Figure 10:
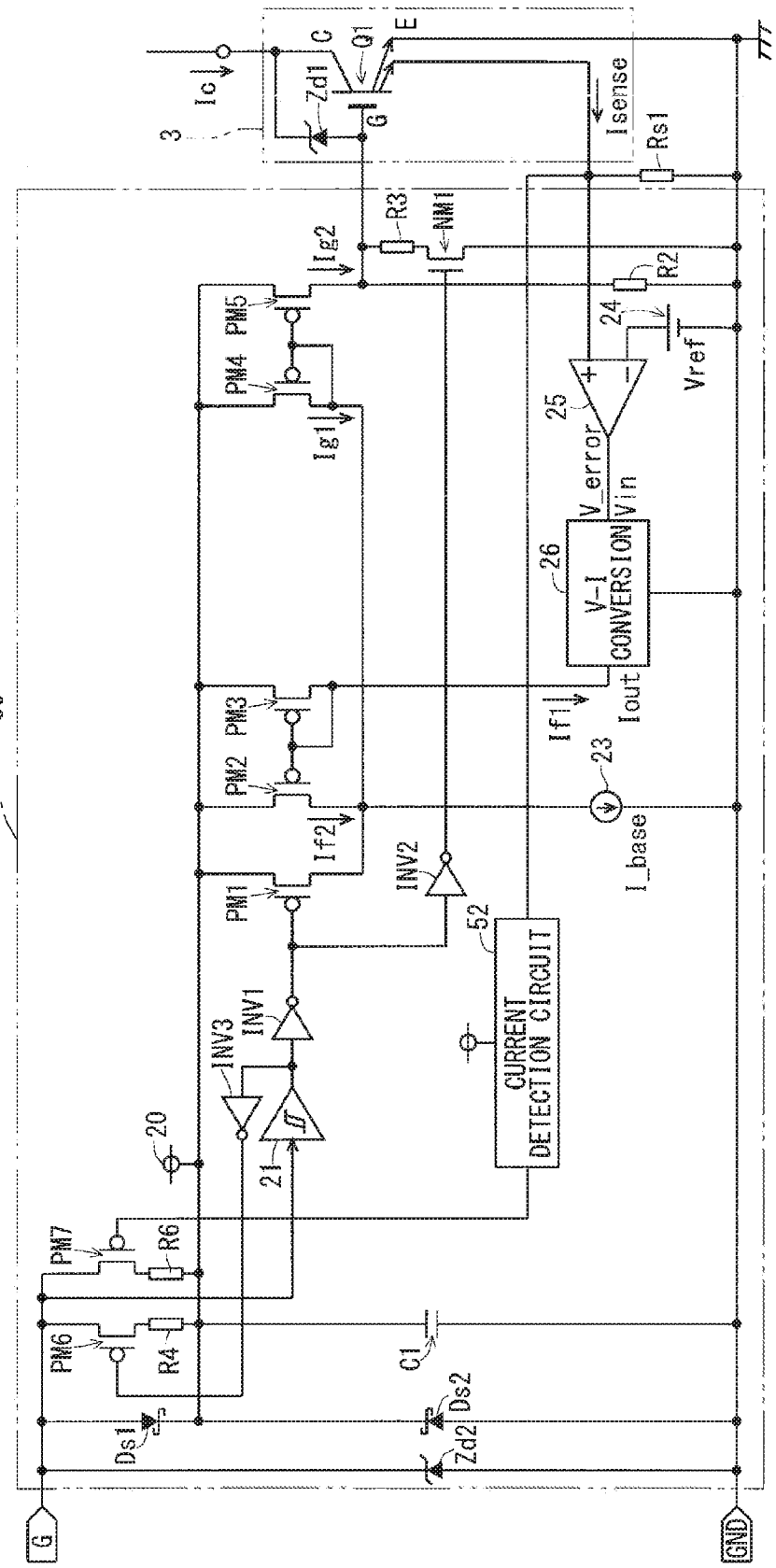
FIG. 10 A diagram showing a configuration of a control circuit 56 and the switching element part 3 of a semiconductor device 55 according to a sixth embodiment of the present invention.

FIG. 10 is a diagram showing a configuration of a control circuit 56 and the switching element part 3 of a semiconductor device 55 according to a sixth embodiment of the present invention. The semiconductor device 55 is, in place of the semiconductor device 1 shown in FIG. 1 described above, included in the ignition device 10. The semiconductor device 55 according to the present embodiment has the same configuration as that of the semiconductor device 45 according to the fourth embodiment shown in FIG. 8 described above except for the configuration described below. The configuration of the control circuit 56 according to the present embodiment is similar to the configuration of the control circuit 46 according to the fourth embodiment. Thus, the same reference signs indicate the same constituent components of the control circuit 46, and a description applied in common is omitted.

Besides the constituent components of the control circuit 46 according to the fourth embodiment, the control circuit 56 according to the present embodiment includes a sixth resistor R6, a seventh PMOS transistor PM7, and the current detection circuit 52 that is the integrated circuit capable of detecting a current flowing through the IGBT Q1 that is the switching element.

The source of the seventh PMOS transistor PM7 is connected with the output terminal G of the drive circuit 11, the anode of the first Schottky barrier diode Ds1, the source of the sixth PMOS transistor PM6, and the input terminal of the Schmitt trigger circuit 21. The drain of the seventh PMOS transistor PM7 is connected with one end of the sixth resistor R6. The other end of the sixth resistor R6 is connected with the internal power source 20. The input terminal of the current detection circuit 52 is connected with one end of the current detection resistor Rs1. The output terminal of the current detection circuit 52 is connected with the gate of the seventh PMOS transistor PM7.

In a case where a current flowing through the IGBT Q1, in other words, the collector current Ic that is the load current exceeds the predetermined current value, the current detection circuit 52 outputs a Low-level signal of 1 pulse to the seventh PMOS transistor PM7.

When the current detection circuit 52 determines that the collector current Ic exceeds the predetermined current value, in other words, the collector current Ic is an overcurrent, it outputs a Low-level signal of 1 pulse to the seventh PMOS transistor PM7 as described above, thereby turning on the seventh PMOS transistor PM7. This can cause a current that depends on the sixth resistor R6 to flow toward the drive circuit 11 through the use of electric charges in the external capacitor C1.

The current is monitored through, for example, the drive circuit 11, so that the overcurrent information can be transmitted from the drive circuit 11 to the ECU 6 that is the control computer. Consequently, the ECU 6 can control the integrated circuit 2 to turn off the IGBT Q1, to thereby avoid the risk of burnout caused by an overcurrent. This can improve the durability and the reliability of the engine system as a whole.

According to the configuration of the control circuit 56 of the present embodiment, an overcurrent can be detected while the signal level of the output signal output from the drive circuit 11 is the Low level, in other words, the IGBT Q1 that is the switching element is ON.

The signal output from the current detection circuit 52 to the seventh PMOS transistor PM7 is not limited to the Low-level signal of 1 pulse, and may be a signal that has been subjected to the pulse width modulation applied in accordance with the current level. The signal may be modulated by a modulation technique other than the pulse width modulation. The signal modulated by any one of the modulation techniques can produce the same effect as that in a case where the Low-level signal of 1 pulse is used.

Seventh Embodiment

Figure 11:
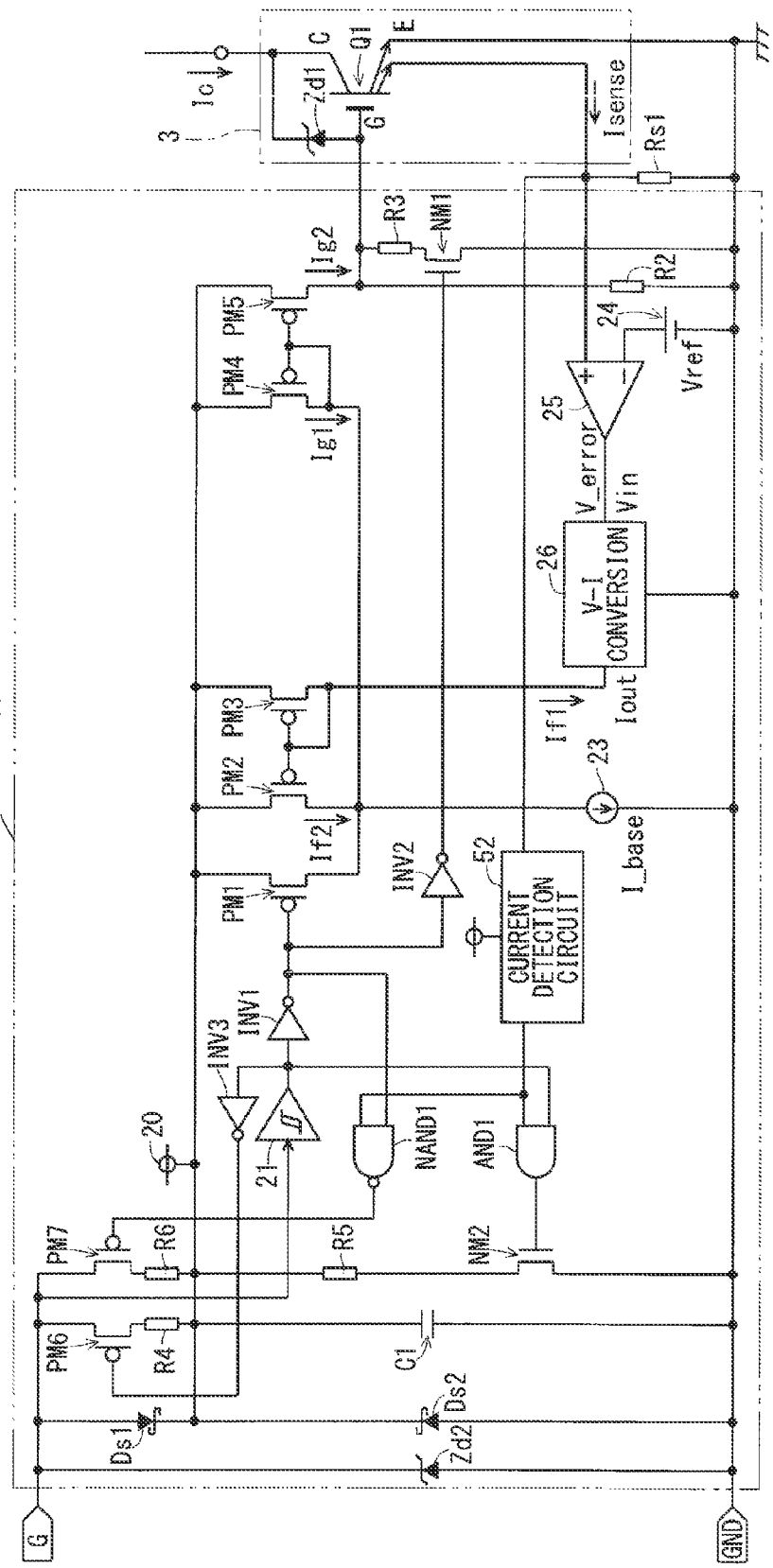
FIG. 11 A diagram showing a configuration of a control circuit 61 and the switching element part 3 of a semiconductor device 60 according to a seventh embodiment of the present invention.

FIG. 11 is a diagram showing a configuration of a control circuit 61 and the switching element part 3 of a semiconductor device 60 according a seventh embodiment. The semiconductor device 60 is, in place of the semiconductor device 1 shown in FIG. 1 described above, included in the ignition device 10. The semiconductor device 60 according to the present embodiment has the same configuration as that of the semiconductor device 50 according to the fifth embodiment shown in FIG. 9 described above except for the configuration of the control circuit 61. The configuration of the control circuit 61 according to the present embodiment is similar to the configuration of the control circuit 51 according to the fifth embodiment. Thus, the same reference signs indicate the same constituent components of the control circuit 51, and a description applied in common is omitted.

Besides the constituent components of the control circuit 51 according to the fifth embodiment, the control circuit 61 according to the present embodiment includes the sixth resistor R6, the seventh PMOS transistor PM7, a first AND circuit AND1, and a first NAND circuit NAND1. Similarly to the control circuit 51 according to the fifth embodiment, the control circuit 61 includes the current detection circuit 52 that is the integrated circuit capable of detecting a current flowing through the IGBT Q1 that is the switching element.

The source of the seventh PMOS transistor PM7 is connected with the output terminal G of the drive circuit 11, the anode of the first Schottky barrier diode Ds1, the source of the sixth PMOS transistor PM6, and the input terminal of the Schmitt trigger circuit 21. The drain of the seventh PMOS transistor PM7 is connected with one end of the sixth resistor R6. The other end of the sixth resistor R6 is connected with the internal power source 20. The input terminal of the current detection circuit 52 is connected with one end of the current detection resistor Rs1.

The output terminal of the current detection circuit 52 is connected with one input terminal of the first AND circuit AND1 and one input terminal of the first NAND circuit NAND1. The other input terminal of the first AND circuit AND1 is connected with the junction between the output terminal of the Schmitt trigger circuit 21 and the input terminal of the first inverter circuit INV1. The other input terminal of the first NAND circuit NAND1 is connected with the output terminal of the first inverter circuit INV1.

The output terminal of the first AND circuit AND1 is connected with the gate of the second NMOS transistor NM2. The output terminal of the first NAND circuit NAND1 is connected with the gate of the seventh PMOS transistor PM7.

In a case where a current flowing through the IGBT Q1, in other words, the collector current Ic that is the load current exceeds the predetermined current value, the current detection circuit 52 turns on the second NMOS transistor NM2 or the seventh PMOS transistor PM7 depending on whether the signal level of the output signal output from the drive circuit 11 is the Hi level or the Low level. The current detection circuit 52 provides a signal of 1 pulse to one of the second NMOS transistor NM2 and the seventh PMOS transistor PM7 that is to be turned on.

When the current detection circuit 52 determines the occurrence of overcurrent while the signal level of the output signal output from the drive circuit 11 is the Hi level, the current detection circuit 52 turns on the second NMOS transistor NM2. When the current detection circuit 52 determines the occurrence of overcurrent while the signal level of the output signal output from the drive circuit 11 is the Low level, the current determination circuit 52 turns on the seventh PMOS transistor PM7. Consequently, a current that depends on the fifth or sixth resistor R5 or R6 is generated.

These changes in current are monitored through, for example, the drive circuit 11, so that the overcurrent information can be transmitted from the drive circuit 11 to the ECU 6 that is the control computer. Thus, no matter whether the signal level of the output signal output from the drive circuit 11 is the Hi level or Low level, the ECU 6 can control the integrated circuit 2 to turn off the IGBT Q1. As a result, the risk of burnout can be avoided.

As described above, no matter whether the signal level of the output signal output from the drive circuit 11 is the Hi level or Low level, the configuration of the control circuit 61 according to the present embodiment allows for the detection of overcurrent.

The signal output from the current detection circuit 52 to the second NMOS transistor NM2 or the seventh PMOS transistor PM7 is not limited to the signal of 1 pulse, and may be a signal that has been subjected to the pulse width modulation applied in accordance with the current level. The signal may be modulated by a modulation technique other than the pulse width modulation. The signal modulated by any one of the modulation techniques can produce the same effect as that in a case where the signal of 1 pulse is used.

Eighth Embodiment

FIG. 12 is a diagram showing a control circuit 66 and the switching element part 3 of a semiconductor device 65 according an eighth embodiment of the present invention. The semiconductor device 65 is, in place of the semiconductor device 1 shown in FIG. 1 described above, included in the ignition device 10. The semiconductor device 65 according to the present embodiment has the same configuration as that of the semiconductor device 45 according to the fourth embodiment shown in FIG. 8 described above except for the configuration described below. The configuration of the control circuit 66 according to the present embodiment is similar to the configuration of the control circuit 46 according to the fourth embodiment. Thus, the same reference signs indicate the same constituent components of the control circuit 46, and a description applied in common is omitted.

Besides the constituent components of the control circuit 46 according to the fourth embodiment, the control circuit 66 according to the present embodiment includes the fifth resistor R5, the second NMOS transistor NM2, and a temperature detection circuit 67 that is the integrated circuit capable of detecting heat through a temperature detecting diode D1.

One end of the fifth resistor R5 is connected with the internal power source 20. The other end of the fifth resistor R5 is connected with the drain of the second NMOS transistor NM2. The source of the second NMOS transistor NM2 is connected with the ground terminal GND of the power semiconductor ground 8. The temperature detection circuit 67 is connected with the gate of the second NMOS transistor NM2.

In a case where the temperature detected through the temperature detecting diode D1 exceeds the predetermined temperature, in other words, in the case of abnormal temperature, the temperature detection circuit 67 outputs a Hi-level signal of 1 pulse to the second NMOS transistor NM2.

Under abnormal temperature, the forward voltage VF across the temperature detecting diode D1 decreases. The temperature detection circuit 67 determines the occurrence of abnormal temperature by detecting a decrease in the forward voltage VF across the temperature detecting diode D1. When the temperature detection circuit 67 determines the occurrence of abnormal temperature, it outputs a Hi-level signal of 1 pulse to the gate of the second NMOS transistor NM2 as described above, to thereby turn on the second NMOS transistor NM2. Consequently, a current that depends on the fifth resistor R5 flows, which increases the consumption current in the control circuit 66. The circuit formed by the second NMOS transistor NM2 and the fifth resistor R5 is equivalent to the circuit that increases the consumption current in the control circuit 66.

The consumption current in the control circuit 66 is monitored through, for example, the drive circuit 11, so that the information (hereinafter also referred to as "abnormal temperature information") indicating the occurrence of abnormal temperature can be transmitted from the drive circuit 11 to the ECU 6 that is the control computer. Consequently, the ECU 6 can control the integrated circuit 2 to turn off the IGBT Q1, to thereby avoid the risk of burnout caused by an abnormal temperature.

According to the configuration of the control circuit 66 of the present embodiment, an abnormal temperature can be detected while the signal level of the output signal output from the drive circuit 11 is the Hi level, in other words, the IGBT Q1 that is the switching element is OFF.

The signal output from the temperature detection circuit 67 to the second NMOS transistor NM2 is not limited to the Hi-level signal of 1 pulse, and may be a signal that has been subjected to the pulse width modulation applied in accordance with the current level. The signal may be modulated by a modulation technique other than the pulse width modulation. The signal modulated by any one of the modulation techniques can produce the same effect as that in a case where the Hi-level signal of 1 pulse is used.

Ninth Embodiment

Figure 13:
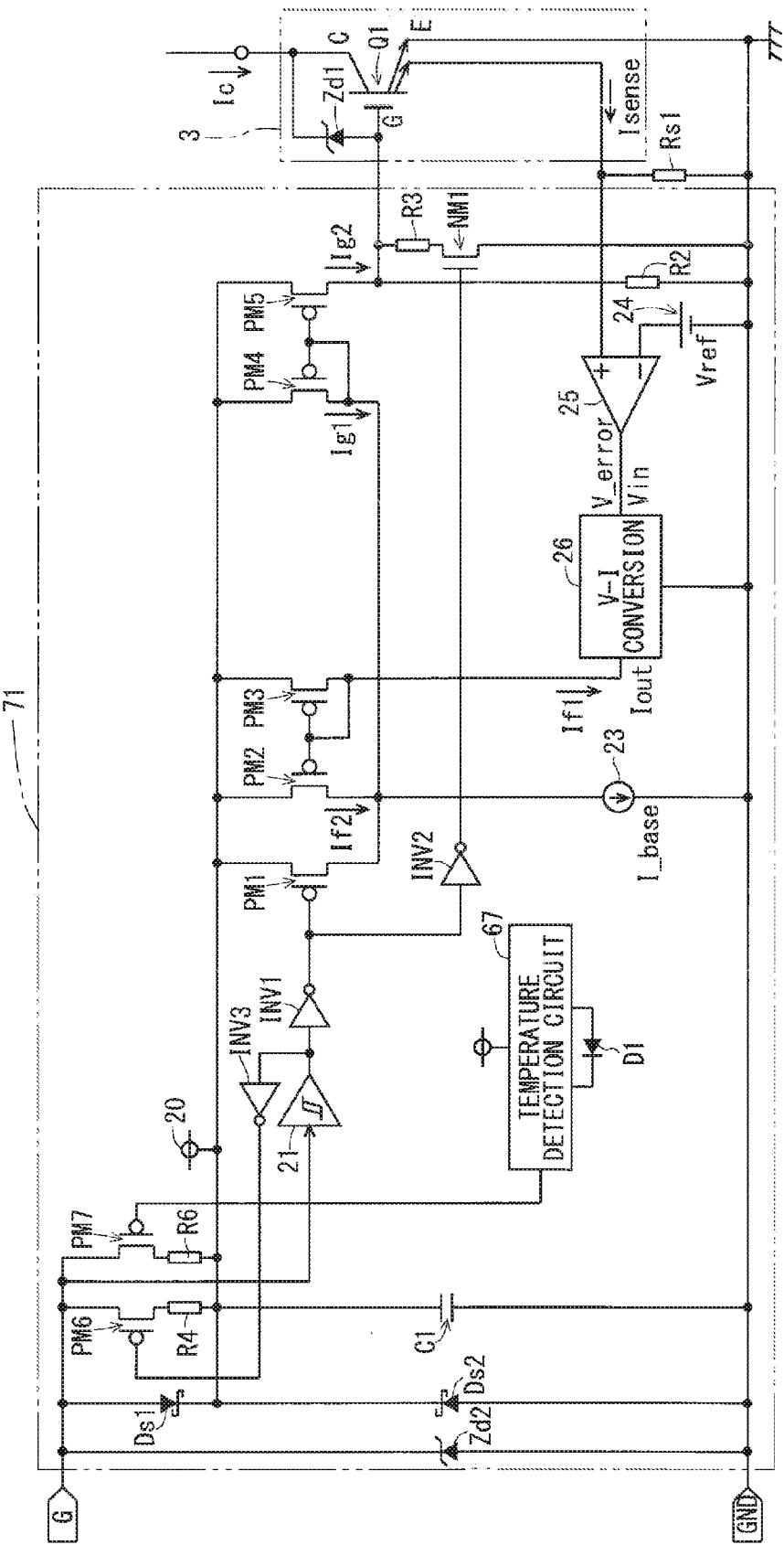
FIG. 13 A diagram showing a configuration of a control circuit 71 and the switching element part 3 of a semiconductor device 70 according to a ninth embodiment of the present invention.

FIG. 13 is a diagram showing a configuration of a control circuit 71 and the switching element part 3 of a semiconductor device 70 according to a ninth embodiment of the present invention. The semiconductor device 70 is, in place of the semiconductor device 1 shown in FIG. 1 described above, included in the ignition device 10. The semiconductor device 70 according to the present embodiment has the same configuration as that of the semiconductor device 45 according to the fourth embodiment shown in FIG. 8 described above except for the configuration described below. The configuration of the control circuit 71 according to the present embodiment is similar to the configuration of the control circuit 46 according to the fourth embodiment. Thus, the same reference signs indicate the same constituent components of the control circuit 46, and a description applied in common is omitted.

Besides the constituent components of the control circuit 46 according to the fourth embodiment, the control circuit 71 according to the present embodiment includes the sixth resistor R6, the seventh PMOS transistor PM7, and the temperature detection circuit 67 that is the integrated circuit capable of detecting heat through the temperature detecting diode D1.

The source of the seventh PMOS transistor PM7 is connected with the output terminal G of the drive circuit 11, the anode of the first Schottky barrier diode Ds1, the source of the sixth PMOS transistor PM6, and the input terminal of the Schmitt trigger circuit 21. The drain of the seventh PMOS transistor PM7 is connected with one end of the sixth resistor R6. The other end of the sixth resistor R6 is connected with the internal power source 20. The temperature detection circuit 67 is connected with the gate of the seventh PMOS transistor PM7.

The temperature detection circuit 67 has the same configuration as that of the temperature detection circuit 67 according to the eighth embodiment shown in FIG. 12. In a case where the temperature detected through the temperature detecting diode D1 exceeds the predetermined temperature, the temperature detecting circuit 67 determines the occurrence of abnormal temperature, and thus, outputs a Low-level signal of 1 pulse to the seventh PMOS transistor PM7.

When the temperature detection circuit 67 determines the occurrence of abnormal temperature, it outputs a Low-level signal of 1 pulse to the seventh PMOS transistor PM7 as described above, to thereby turn on the seventh PMOS transistor PM7. This can cause a current that depends on the sixth resistor R6 to flow toward the drive circuit 11 through the use of electric charges in the external capacitor C1.

The current is monitored through, for example, the drive circuit 11, so that the abnormal temperature information can be transmitted from the drive circuit 11 to the ECU 6 that is the control computer. Consequently, the ECU 6 can control the integrated circuit 2 to turn off the IGBT Q1, to thereby avoid the risk of burnout caused by an abnormal temperature.

According to the configuration of the control circuit 71 of the present embodiment, an abnormal temperature can be detected while the signal level of the output signal output from the drive circuit 11 is the Low level, in other words, the IGBT Q1 that is the switching element is ON.

The signal output from the temperature detection circuit 67 to the seventh PMOS transistor PM7 is not limited to the Low-level signal of 1 pulse, and may be a signal that has been subjected to the pulse width modulation applied in accordance with the current level. The signal may be modulated by a modulation technique other than the pulse width modulation. The signal modulated by any one of the modulation techniques can produce the same effect as that in a case where the Low-level signal of 1 pulse is used.

Tenth Embodiment

Figure 14:
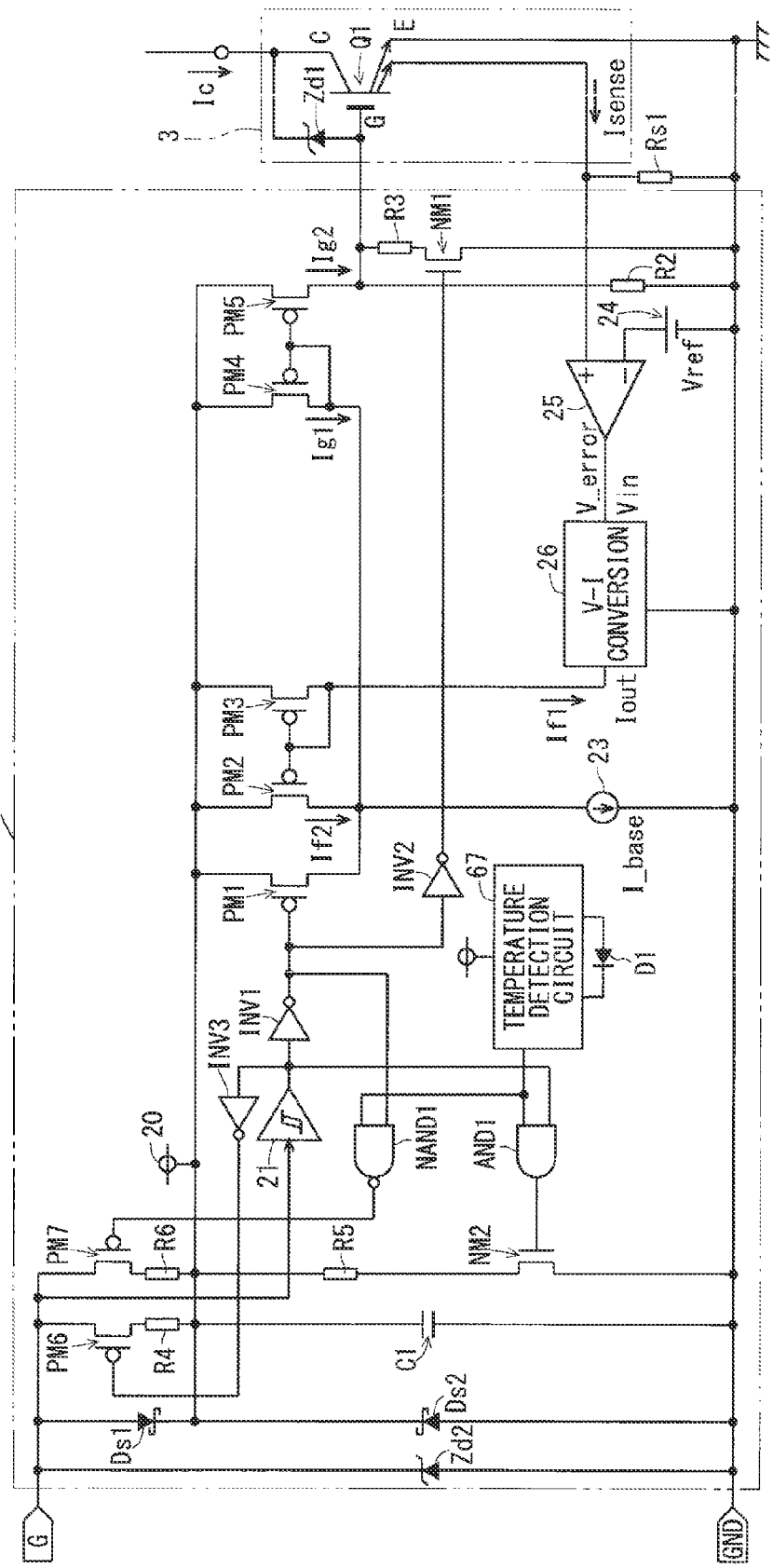
FIG. 14 A diagram showing a configuration of a control circuit 76 and a switching element part 3 of a semiconductor device 75 according a tenth embodiment of the present invention.

FIG. 14 is a diagram showing a configuration of a control circuit 76 and the switching element part 3 of a semiconductor device 75 according to a tenth embodiment of the present invention. The semiconductor device 75 is, in place of the semiconductor device 1 shown in FIG. 1 described above, included in the ignition device 10. The semiconductor device 75 according to the present embodiment has the same configuration as that of the semiconductor device 65 according to the eighth embodiment shown in FIG. 12 described above except for the configuration of the control circuit 76. The configuration of the control circuit 76 according to the present embodiment is similar to the configuration of the control circuit 66 according to the eighth embodiment. Thus, the same reference signs indicate the same constituent components of the control circuit 66, and a description applied in common is omitted.

Besides the constituent components of the control circuit 66 according to the eighth embodiment, the control circuit 76 according to the present embodiment includes the sixth resistor R6, the seventh PMOS transistor PM7, the first AND circuit AND1, and the first NAND circuit NAND1. Similarly to the control circuit 66 according to the eighth embodiment, the control circuit 76 also includes the temperature detection circuit 67 that is the integrated circuit capable of detecting heat through the temperature detecting diode D1.

The source of the seventh PMOS transistor PM7 is connected with the output terminal G of the drive circuit 11, the anode of the first Schottky barrier diode Ds1, the source of the sixth PMOS transistor PM6, and the input terminal of the Schmitt trigger circuit 21. The drain of the seventh PMOS transistor PM7 is connected with one end of the sixth resistor R6. The other end of the sixth resistor R6 is connected with the internal power source 20.

The temperature detection circuit 67 is connected with one input terminal of the first AND circuit AND1 and one input terminal of the first NAND circuit NAND1. The other input terminal of the first AND circuit AND1 is connected with the junction between the output terminal of the Schmitt trigger circuit 21 and the input terminal of the first inverter circuit INV1. The other input terminal of the first NAND circuit NAND1 is connected with the output terminal of the first inverter circuit INV1.

The output terminal of the first AND circuit AND1 is connected with the gate of the second NMOS transistor NM2. The output terminal of the first NAND circuit NAND1 is connected with the gate of the seventh PMOS transistor PM7.

The temperature detection circuit 67 has the same configuration as that of the temperature detection circuit 67 according to the eighth embodiment shown in FIG. 12. In a case where the temperature detected through the temperature detecting diode D1 exceeds the predetermined temperature, the temperature detection circuit 67 determines the occurrence of abnormal temperature. The temperature detection circuit 67 turns on the second NMOS transistor NM2 or the seventh PMOS transistor PM7 depending on whether the signal level of the output signal output from the drive circuit 11 is the Hi level or the Low level. The temperature detection circuit 67 provides a signal of 1 pulse to the transistor to be turned on.

When the temperature detection circuit 67 determines the occurrence of abnormal temperature while the signal level of the output signal output from the drive circuit 11 is the Hi level, the temperature detection circuit 67 turns on the second NMOS transistor NM2. When the temperature detection circuit 67 determines the occurrence of abnormal temperature while the signal level of the output signal output from the drive circuit 11 is the Low level, the temperature detection circuit 67 turns on the seventh PMOS transistor PM7. Consequently, a current that depends on the fifth or sixth resistor R5 or R6 is generated.

These changes in current are monitored through, for example, the drive circuit 11, so that the abnormal temperature information can be transmitted from the drive circuit 11 to the ECU 6 that is the control computer. Thus, the ECU 6 can control the integrated circuit 2 to turn off the IGBT Q1, thereby avoiding the risk of burnout caused by an abnormal temperature.

As described above, no matter whether the signal level of the output signal output from the drive circuit 11 is the Hi level or Low level, the configuration of the control circuit 76 according to the present embodiment allows for the detection of abnormal temperature.

The signal output from the temperature detection circuit 67 to the second NMOS transistor NM2 or the seventh PMOS transistor PM7 is not limited to the signal of 1 pulse, and may be a signal that has been subjected to the pulse width modulation applied in accordance with the current level. The signal may be modulated by a modulation technique other than the pulse width modulation. The signal modulated by any one of the modulation techniques can produce the same effect as that in a case where the signal of 1 pulse is used.

Eleventh Embodiment

Figure 15:
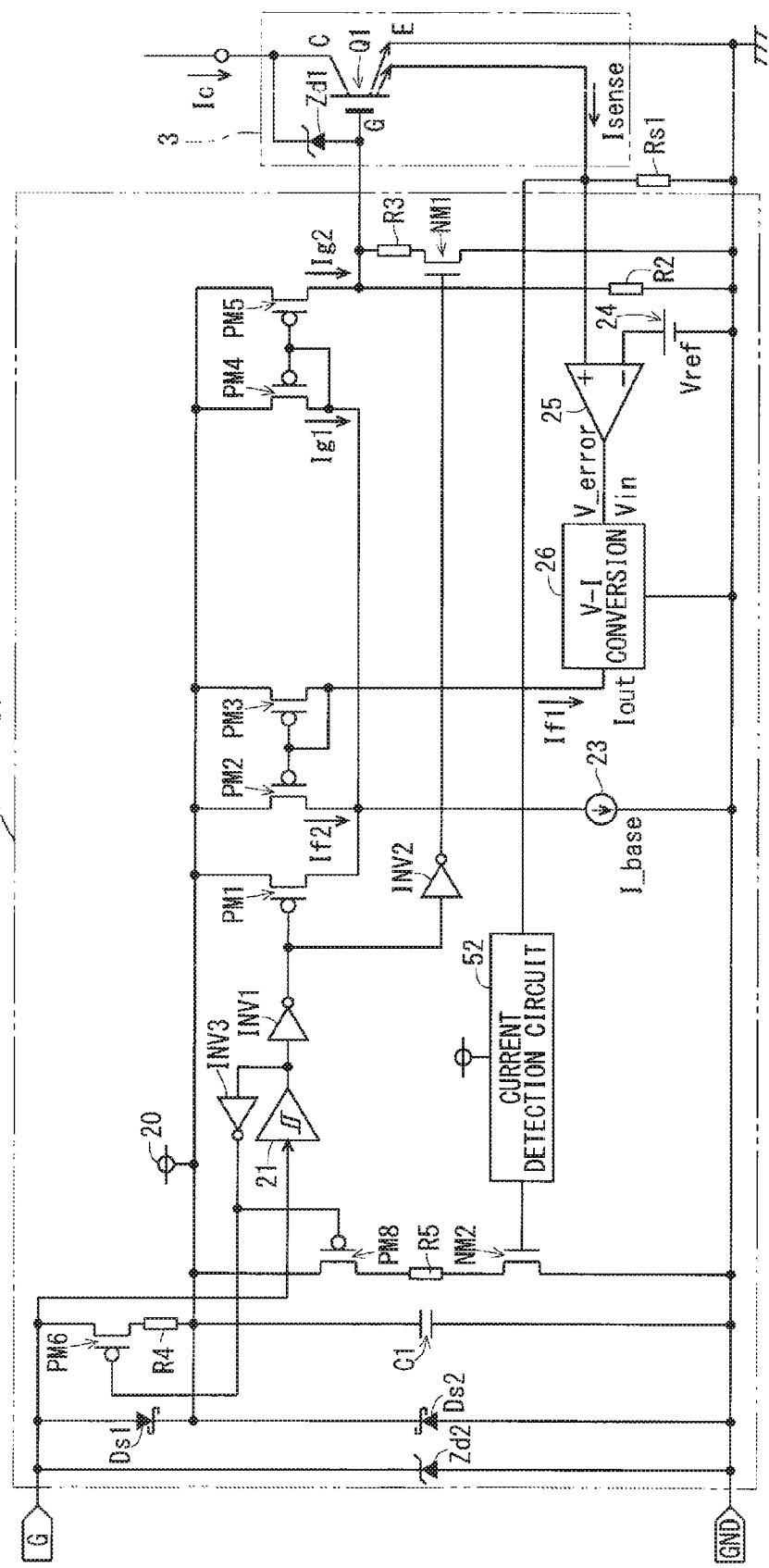
FIG. 15 A diagram showing a configuration of a control circuit 81 and the switching element part 3 of a semiconductor device 80 according to an eleventh embodiment of the present invention.

FIG. 15 is a diagram showing a configuration of a control circuit 81 and the switching element part 3 of a semiconductor device 80 according to an eleventh embodiment of the present invention. The semiconductor device 80 is, in place of the semiconductor device 1 shown in FIG. 1 described above, included in the ignition device 10. The semiconductor device 80 according to the present embodiment has the same configuration as that of the semiconductor device 50 according to the fifth embodiment shown in FIG. 9 described above except for the configuration described below. The configuration of the control circuit 81 according to the present embodiment is similar to the configuration of the control circuit 51 according to the fifth embodiment. Thus, the same reference signs indicate the same constituent components of the control circuit 51, and a description applied in common is omitted.

As for the control circuits 51 and 66 according to the fifth and eighth embodiments described above, an overcurrent or an abnormal temperature can be detected by monitoring the consumption current in the control circuits 51 and 66 while the signal level of the output signal output from the drive circuit 11 is the Hi level. However, there is a possibility that an overcurrent or an abnormal temperature will not be detected while the signal level of the output signal output from the drive circuit 11 is the Low level.

When an overcurrent or an abnormal temperature is detected while the signal level of the output signal output from the drive circuit 11 is the Low level, the second NMOS transistor NM2 is turned on, which may cause electric charges in the external capacitor C1 to be discharged through the fifth resistor R5.

Thus, the control circuit 81 according to the present embodiment includes an eighth PMOS transistor PM8 located between the fifth resistor R5 and the internal power source 20. The source of the eighth PMOS transistor PM8 is connected with the internal power source 20. The drain of the eighth PMOS transistor PM8 is connected with one end of the fifth resistor R5. The gate of the eighth PMOS transistor PM8 is connected with the gate of the sixth PMOS transistor PM6 and the output terminal of the third inverter circuit INV3.

When the signal level of the output signal output from the drive circuit 11 is the Low level, the control circuit 81 turns off the eighth PMOS transistor PM8. Consequently, unnecessary discharging of the external capacitor C1 can be avoided, which prolongs the time period over which the control circuit 81 can drive the IGBT Q1.

According to the present embodiment as described above, the control circuit 81 includes the eighth PMOS transistor PM8 located between the fifth resistor R5 and the internal power source 20. Thus, unnecessary discharging of the external capacitor C1 can be avoided by turning off the eighth PMOS transistor PM8. This prolongs the time period over which the control circuit 81 can drive the IGBT Q1.

Modification of Eleventh Embodiment

Figure 16:
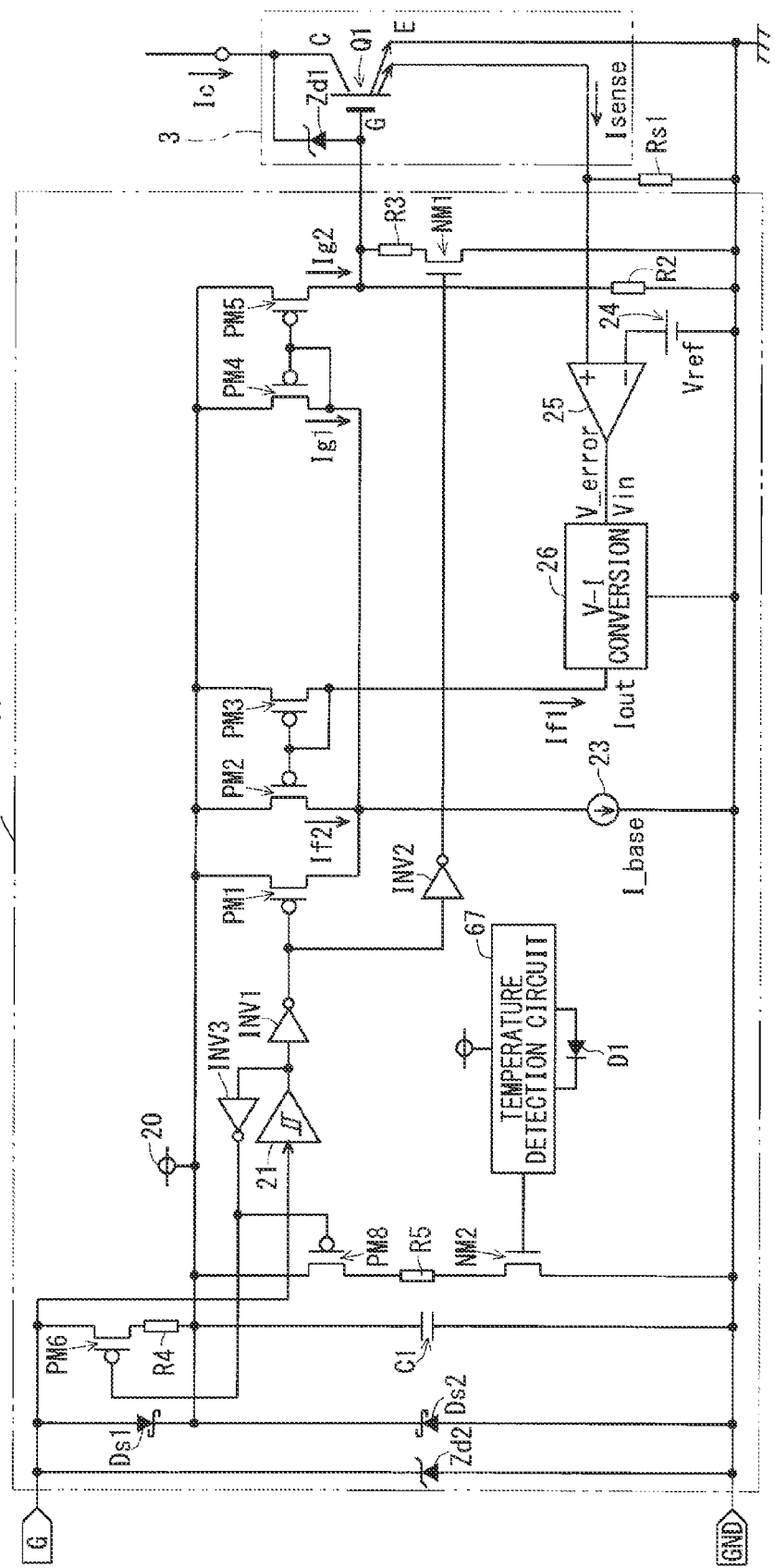
FIG. 16 A diagram showing a configuration of a control circuit 86 and the switching element part 3 of a semiconductor device 85 according to a modification of the eleventh embodiment of the present invention.

FIG. 16 is a diagram showing a configuration of a control circuit 86 and the switching element part 3 of a semiconductor device 85 according to a modification of the eleventh embodiment of the present invention. The semiconductor device 85 is, in place of the semiconductor device 1 shown in FIG. 1 described above, included in the ignition device 10.

The semiconductor device 85 according to the present modification has the same configuration as that of the semiconductor device 80 according to the eleventh embodiment except that the semiconductor device 85 includes the temperature detection circuit 67 in place of the current detection circuit 52 provided in the semiconductor device 80 according to the eleventh embodiment. The temperature detection circuit 67 has the same configuration as that of the temperature detection circuit 67 according the eighth embodiment shown in FIG. 12. The configuration of the control circuit 86 according to the present modification is similar to the configuration of the control circuit 66 according to the eighth embodiment. Thus, the same reference signs indicate the same constituent components of the control circuit 66, and a description applied in common is omitted.

As in the eleventh embodiment, the eighth PMOS transistor PM8 is connected between the fifth resistor R5 and the internal power source 20 in the control circuit 86 according to the present modification. This produces the same effect as that of the eleventh embodiment. In particular, unnecessary discharging of the external capacitor C1 can be avoided, which prolongs the time period over which the control circuit 86 can drive the IGBT Q1.

Twelfth Embodiment

Figure 17:
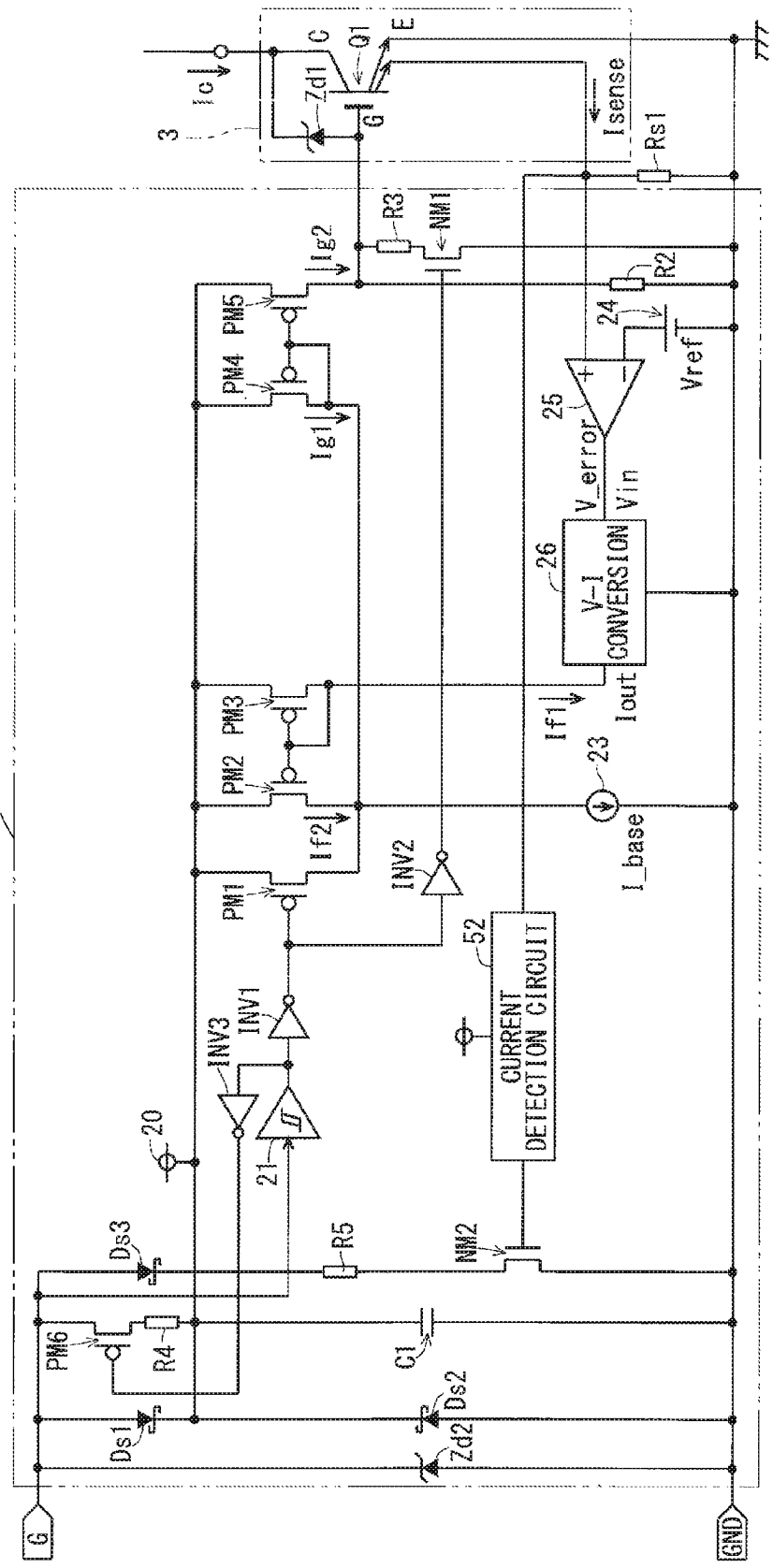
FIG. 17 A diagram showing a configuration of a control circuit 91 and the switching element part 3 of a semiconductor device 90 according to a twelfth embodiment of the present invention.

FIG. 17 is a diagram showing a configuration of a control circuit 91 and the switching element part 3 of a semiconductor device 90 according to a twelfth embodiment of the present invention. The semiconductor device 90 is, in place of the semiconductor device 1 shown in FIG. 1 described above, included in the ignition device 10. The semiconductor device 90 according to the present embodiment has the same configuration as that of the semiconductor device 50 according to the fifth embodiment shown in FIG. 9 described above except for the configuration described below. The configuration of the control circuit 91 according to the present embodiment is similar to the configuration of the control circuit 51 according to the fifth embodiment. Thus, the same reference signs indicate the same constituent components of the control circuit 51, and a description applied in common is omitted. In the present embodiment, the circuit formed by the second NMOS transistor NM2 and the fifth resistor R5 is equivalent to the circuit that increases the consumption current in the control circuit 91.

As for the control circuits 51 and 66 according to the fifth and eighth embodiments described above, when an overcurrent or an abnormal temperature is detected while the signal level of the output signal output from the drive circuit 11 is the Low level, the second NMOS transistor NM2 is turned on, which may cause electric charges in the external capacitor C1 to be discharged.

Thus, the fifth resistor R5 is connected with the output terminal G of the drive circuit 11 through a third Schottky barrier diode Ds3 in the control circuit 91 according to the present embodiment. In particular, the anode of the third Schottky barrier diode Ds3 is connected with the output terminal G of the drive circuit 11. The cathode of the third Schottky barrier diode Ds3 is connected with one end of the fifth resistor R5.

Thus, according to the present embodiment, the circuit formed by the second NMOS transistor NM2 and the fifth resistor R5, which is the circuit that increases the consumption current in the control circuit 91, is connected with the drive circuit 11 through the third Schottky barrier diode Ds3. Consequently, unnecessary discharging of the external capacitor C1 can be avoided while the signal level of the output signal output from the drive circuit 11 is the Low level. This prolongs the time period over which the control circuit 91 can drive the IGBT Q1.

In the control circuit 91 according to the present embodiment, an overcurrent can be detected while the signal level of the output signal output from the drive circuit 11 is the Hi level. Besides, an overcurrent can be detected while the signal level of the output signal output from the drive circuit 11 is the Low level.

The Low level of the output signal output from the drive circuit 11 is equal to 0 V, which is the electric potential of the ground terminal GND of the power semiconductor ground 8. Thus, a current does not flow even if the second NMOS transistor NM2 is turned on in response to the detection of overcurrent.

However, if the Low level is set within a range that does not exceed the threshold value of the control circuit 91, a current that depends on the fifth resistor R5 can flow in response to the detection of overcurrent while the signal level of the output signal output from the drive circuit 11 is the Low level. This current is monitored through the drive circuit 11, so that an overcurrent can be detected.

The range that does not exceed the threshold value of the control circuit 91 described above is, for example, about several hundred mV or more to about 1 V or less, and can be set within a rage that does not allow the driving of the IGBT Q1 that is the switching element.

Modification of Twelfth Embodiment

Figure 18:
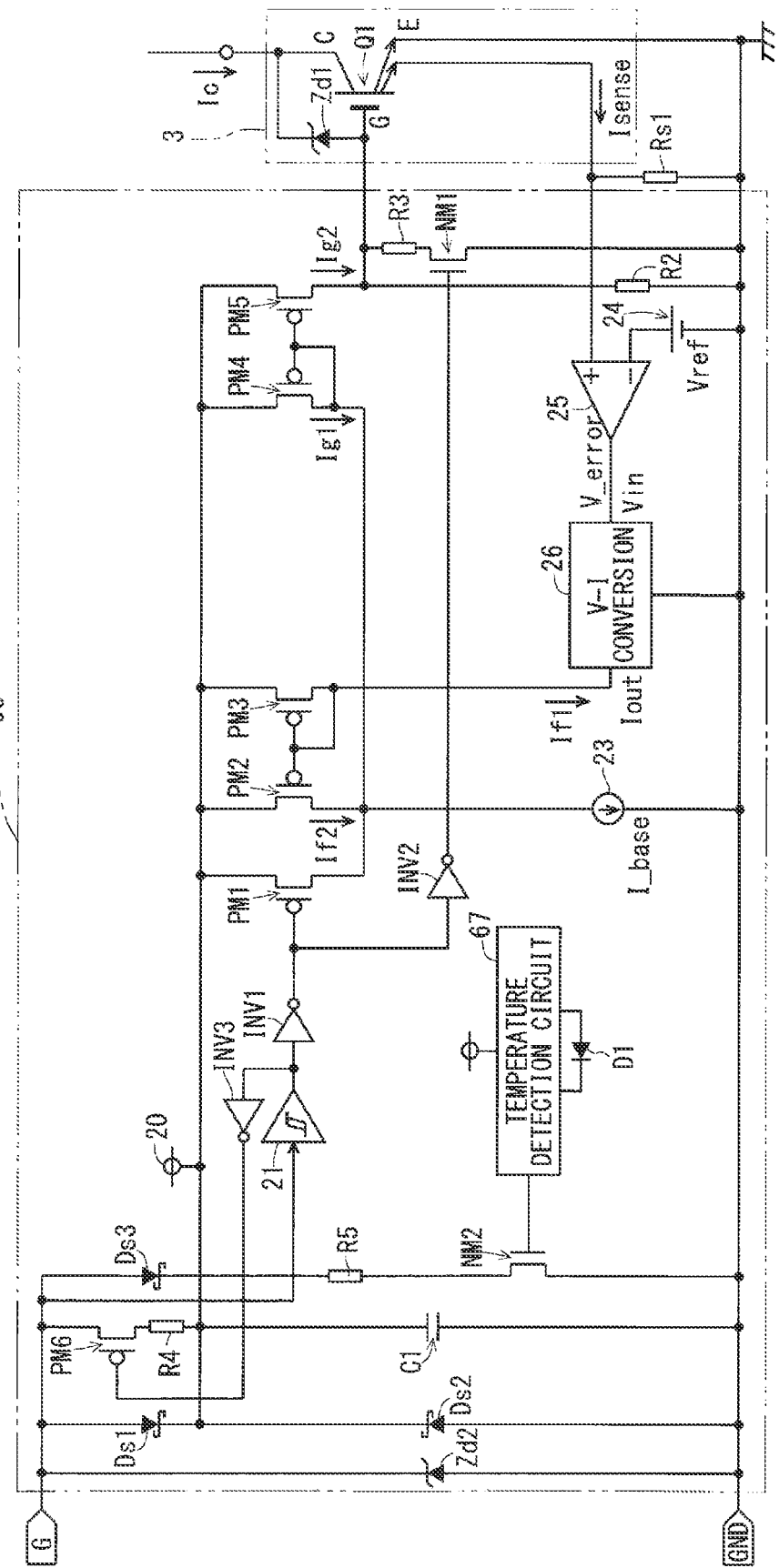
FIG. 18 A diagram showing a configuration of a control circuit 96 and the switching element part 3 of a semiconductor device 95 according to a modification of the twelfth embodiment of the present invention.

FIG. 18 is a diagram showing a configuration of a control circuit 96 and the switching element part 3 of a semiconductor device 95 according a modification of the twelfth embodiment of the present invention. The semiconductor device 95 is, in place of the semiconductor device 1 shown in FIG. 1 described above, included in the ignition device 10.

The semiconductor device 95 according to the present modification has the same configuration as that of the semiconductor device 90 according to the twelfth embodiment except that the semiconductor device 95 includes the temperature detection circuit 67 in place of the current detection circuit 52 provided in the semiconductor device 90 according to the twelfth embodiment shown in FIG. 17. The temperature detection circuit 67 has the same configuration as that of the temperature detection circuit 67 according to the eighth embodiment shown in FIG. 12. The configuration of the control circuit 96 according to the present modification is similar to that of the control circuit 66 according to the eighth embodiment. Thus, the same reference signs indicate the same constituent components of the control circuit 66, and a description applied in common is omitted.

As in the twelfth embodiment, the fifth resistor R5 is connected with the output terminal G of the drive circuit 11 through the third Schottky barrier diode Ds3 in the control circuit 96 according to the present modification. This produces the same effect as that of the twelfth embodiment. In particular, while the signal level of the output signal output from the drive circuit 11 is the Low level, unnecessary discharging of the external capacitor C1 can be avoided, which prolongs the time period over which the control circuit 96 can drive the IGBT Q1.

In the control circuit 96 according to the present modification, an abnormal temperature can be detected while the signal level of the output signal output from the drive circuit 11 is the Hi level. Besides, an abnormal temperature can be detected while the signal level of the output signal output from the drive circuit 11 is the Low level.

The Low level of the output signal output from the drive circuit 11 is equal to 0 V, which is the electric potential of the ground terminal GND of the power semiconductor ground 8. Thus, a current does not flow even if the second NMOS transistor NM2 is turned on in response to the detection of abnormal temperature.

However, if the Low level is set within a range that does not exceed the threshold value of the control circuit 96, a current that depends on the fifth resistor R5 can flow in response to the detection of abnormal temperature while the signal level of the output signal output from the drive circuit 11 is the Low level. This current is monitored through the drive circuit 11, so that an abnormal temperature can be detected.

The range that does not exceed the threshold value of the control circuit 96 described above is, for example, about several hundred mV or more to about 1 V or less, and can be set within a range that does not allow the driving of the IGBT Q1 that is the switching element.

Thirteenth Embodiment

FIG. 19 is a diagram showing a configuration of the drive circuit 11 of the semiconductor device 1 according to the underlying technique of the present invention. The drive circuit 11, together with the control circuit 12 and the current detection resistor Rs1, forms the integrated circuit 2 as shown in FIG. 1 described above.

The drive circuit 11 includes a first NPN transistor N-Tr1, a first PNP transistor P-Tr1, a first base resistor Rb1, a second base resistor Rb2, an eleventh resistor R11, a twelfth resistor R12, and an output resistor Ro.

One end of the first base resistor Rb1 is connected with the input terminal of the drive circuit 11. The input terminal receives the voltage signal $V_{ECU}$ from the ECU 6. The other end of the first base resistor Rb1 is connected with one end of the eleventh resistor R11 and the base of the first NPN transistor N-Tr1. The other end of the eleventh resistor R11 is connected with the ground, particularly, with the control ground 7 shown in FIG. 1 described above. The emitter of the first NPN transistor N-Tr1 is connected with the ground, particularly, with the control ground 7 shown in FIG. 1 described above.

One end of the twelfth resistor R12 and the emitter of the first PNP transistor P-Tr1 receive a Hi-level signal from the ECU 6. The one end of the twelfth resistor R12 is connected with the emitter of the first PNP transistor P-Tr1. The other end of the twelfth resistor R12 is connected with the collector of the first NPN transistor N-Tr1 and the one end of the second base resistor Rb2.

The other end of the second base resistor Rb2 is connected with the base of the first PNP transistor P-Tr1. The collector of the first PNP transistor P-Tr1 is connected with one end of the output resistor Ro. The other end of the output resistor Ro is connected with an output terminal Vout of the drive circuit 11.

Figure 20:
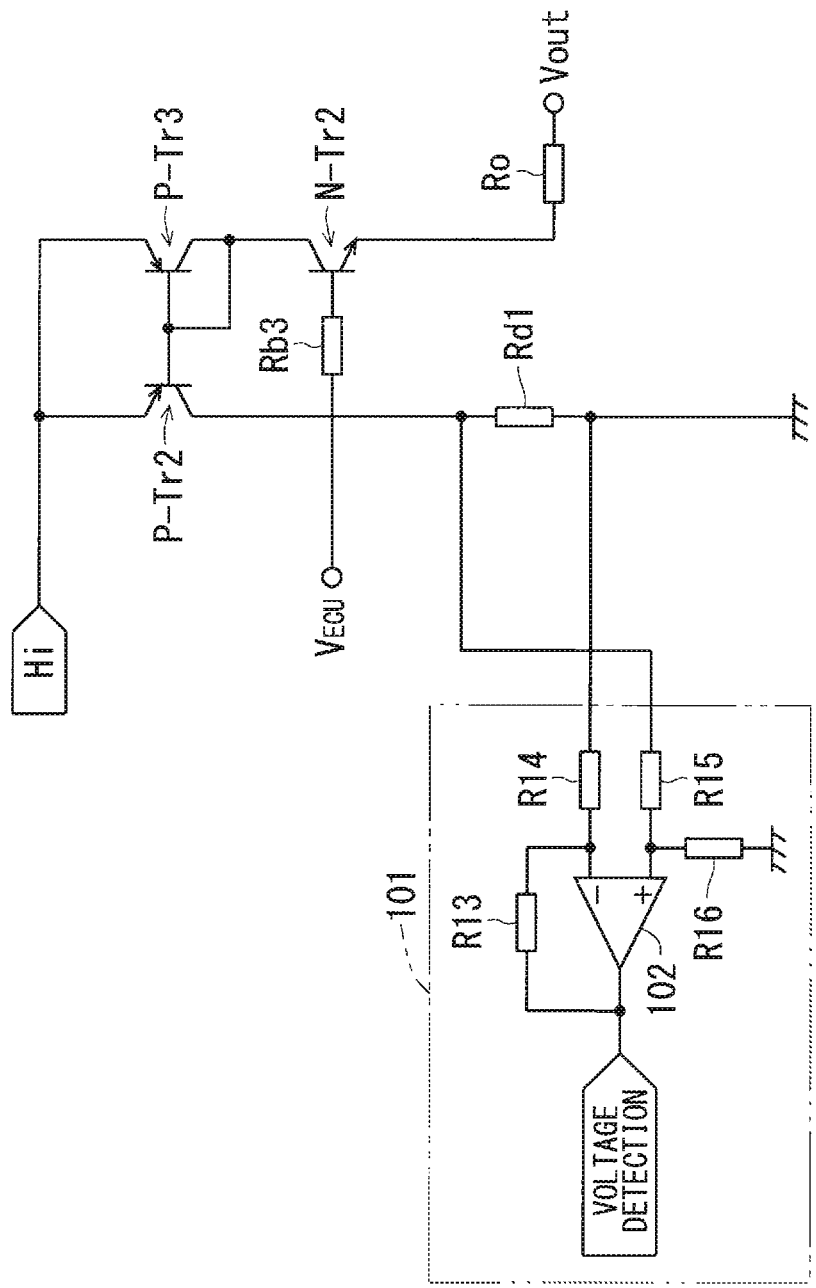
FIG. 20 A diagram showing a drive circuit 100 according to a thirteenth embodiment of the present invention.

FIG. 20 is a diagram showing a configuration of a drive circuit 100 according to a thirteenth embodiment of the present invention. The drive circuit 100 according to the present embodiment has the same configuration as that of the drive circuit 11 according to the underlying technique shown in FIG. 19 described above except for the configuration described below.

The drive circuit 100 includes a voltage detection circuit 101, a second PNP transistor P-Tr2, a third PNP transistor P-Tr3, a second NPN transistor N-Tr2, a detection resistor Rd1, a third base resistor Rb3, and the output resistor Ro. The voltage detection circuit 101 includes a thirteenth resistor R13, a fourteenth resistor R14, a fifteenth resistor R15, a sixteenth resistor R16, and a comparator 102.

One end of the thirteenth resistor R13 is connected with the output terminal of the comparator 102. The other end of the thirteenth resistor R13 is connected with the inverting input terminal of the comparator 102 and one end of the fourteenth resistor R14. The noninverting input terminal of the comparator 102 is connected with one end of the fifteenth resistor R15 and one end of the sixteenth resistor R16. The other end of the sixteenth resistor R16 is connected with the ground, particularly, with the control ground 7 shown in FIG. 1 described above.

One end of the detection resistor Rd1 is connected with the other end of the fifteenth resistor R15 and the collector of the second PNP transistor P-Tr2. The other end of the detection resistor Rd1 is connected with the other end of the fourteenth resistor R14 and the ground, particularly, with the control ground 7 shown in FIG. 1 described above.

The emitter of the second PNP transistor P-Tr2 is connected with the emitter of the third PNP transistor P-Tr3. The base of the second PNP transistor P-Tr2 and the base of the third PNP transistor P-Tr3 are connected in common to be connected with the collector of the third PNP transistor P-Tr3. The emitter of the second PNP transistor P-Tr2 and the emitter of the third PNP transistor P-Tr3 receive a Hi-level signal from the ECU 6.

One end of the third base resistor Rb3 is connected with the input terminal of the drive circuit 100. The input terminal of the drive circuit 100 receives the voltage signal $V_{ECU}$ from the ECU 6. The other end of the third base resistor Rb3 is connected with the base of the second NPN transistor N-Tr2. The collector of the second NPN transistor N-Tr2 is connected with the collector of the third PNP transistor P-Tr3. The emitter of the second NPN transistor N-Tr2 is connected with one end of the output resistor Ro. The other end of the output resistor Ro is connected with the output terminal Vout of the drive circuit 100.

As for the drive circuit 11 according to the underlying technique shown in FIG. 19 described above, a signal whose signal level is the Hi level or the Low level is simply output, as the output signal output from the drive circuit 11, in concert with the signal level, i.e., the Hi level or the Low level, of the output signal output from the ECU 6 that is the control computer.

Meanwhile, besides having the same function as that of the drive circuit 11 according to the underlying technique, the drive circuit 100 according to the present embodiment includes the voltage detection circuit 101 and is therefore capable of detecting the consumption current in the control circuit as the voltage information while the signal level of the output signal output from the drive circuit 100 is the Hi level.

Consequently, at the occurrence of overcurrent or abnormal temperature, the consumption current in the circuit is changed on the control circuit side and the resulting current is monitored through the drive circuit 100, so that the overcurrent information or the abnormal temperature information can be transmitted to the ECU 6 that is the control computer.

In particular, while the signal level of the output signal output from the drive circuit 100 is the Hi level, the current flowing through the third PNP transistor P-Tr3 is substantially equal to the current flowing through the second PNP transistor P-Tr2. The voltage detection circuit 101 therefore detects the current flowing through the second PNP transistor P-Tr2 by converting the current into a voltage value through the detection resistor Rd1.

The drive circuit 100 according to the present embodiment is the drive circuit compatible with, for example, the semiconductor device 50, 65, 80, 85, 90, or 95 according to the fifth, eighth, or eleventh embodiment, the modification of the eleventh embodiment, the twelfth embodiment, or the modification of the twelfth embodiment described above. The drive circuit 100 according to the present embodiment is included in the semiconductor device 50, 65, 80, 85, 90, or 95 according to the fifth, eighth, or eleventh embodiment, the modification of the eleventh embodiment, the twelfth embodiment, or the modification of the twelfth embodiment described above, to thereby produce the following effects. As described above, at the occurrence of overcurrent or abnormal temperature, the changes in the consumption current in the control circuit are monitored through the drive circuit 100, so that the overcurrent information or the abnormal temperature information can be transmitted to the ECU 6 that is the control computer.

Fourteenth Embodiment

Figure 21:
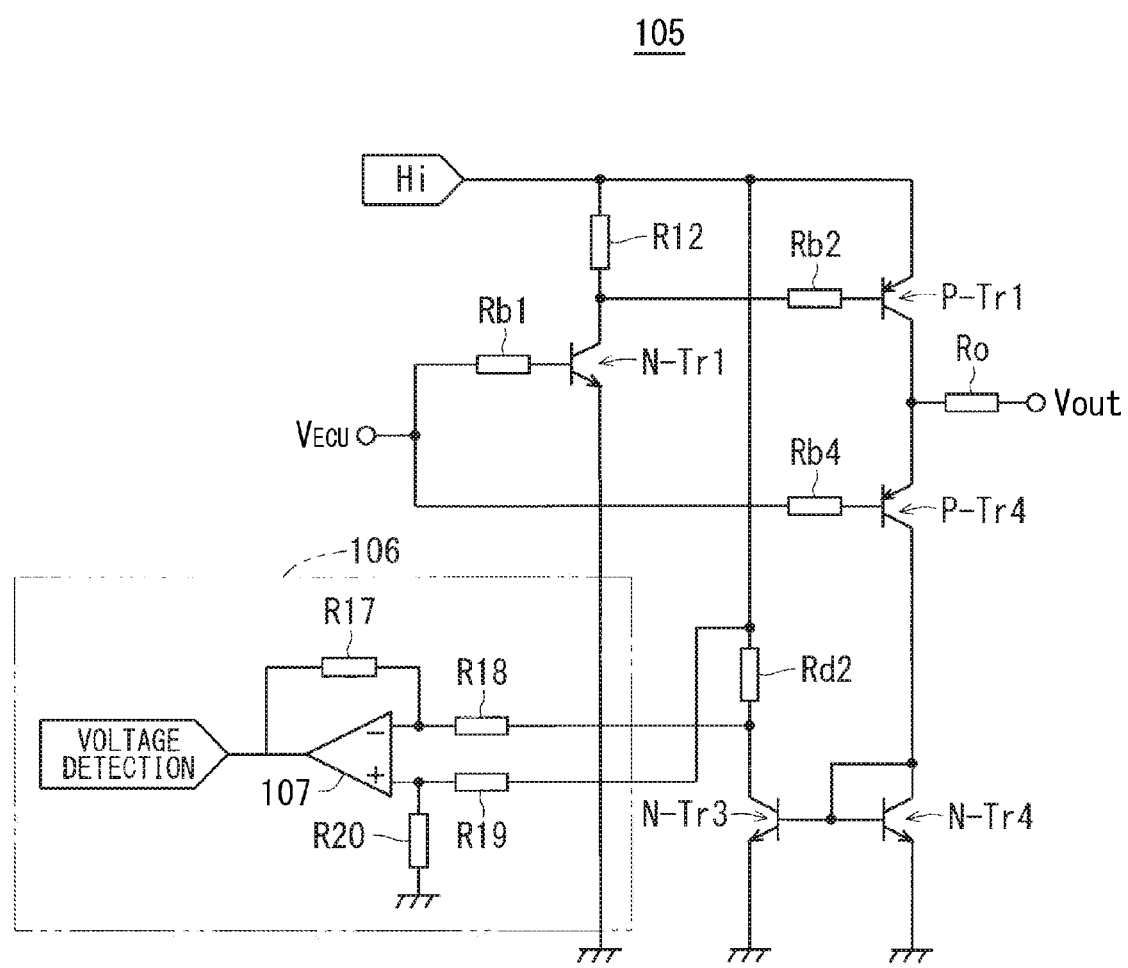
FIG. 21 A diagram showing a configuration of a drive circuit 105 according to a fourteenth embodiment of the present invention.

FIG. 21 is a diagram showing a configuration of a drive circuit 105 according to a fourteenth embodiment of the present invention. The drive circuit 105 according to the present embodiment has the same configuration as that of the drive circuit 11 according to the underlying technique shown in FIG. 19 described above except for the configuration described below.

The drive circuit 105 includes a voltage detection circuit 106, the first NPN transistor N-Tr1, a third NPN transistor N-Tr3, a fourth NPN transistor N-Tr4, the first PNP transistor P-Tr1, a fourth PNP transistor P-Tr4, the first base resistor Rb1, the second base resistor Rb2, a fourth base resistor Rb4, a second detection resistor Rd2, the twelfth resistor R12, and the output resistor Ro. The voltage detection circuit 106 includes a seventeenth resistor R17, an eighteenth resistor R18, a nineteenth resistor R19, a twentieth resistor R20, and a comparator 107.

One end of the seventeenth resistor R17 is connected with the output terminal of the comparator 107. The other end of the seventeenth resistor R17 is connected with the inverting input terminal of the comparator 107 and one end of the eighteenth resistor R18. The noninverting input terminal of the comparator 107 is connected with one end of the nineteenth resistor R19 and one end of the twentieth resistor R20. The other end of the twentieth resistor R20 is connected with the ground, particularly, with the control ground 7 shown in FIG. 1 described above.

The other end of the eighteenth resistor is connected with the other end of the second detection resistor Rd2 and the collector of the third NPN transistor N-Tr3. The other end of the nineteenth resistor R19 is connected with one end of the second detection resistor Rd2, one end of the twelfth resistor R12, and the emitter of the first PNP transistor P-Tr1.

The emitter of the third NPN transistor N-Tr3 is connected with the ground, particularly, with the control ground 7 shown in FIG. 1 described above. The base of the third NPN transistor N-Tr3 and the base of the fourth NPN transistor N-Tr4 are connected in common to be connected with the collector of the fourth NPN transistor N-Tr4. The emitter of the fourth NPN transistor N-Tr4 is connected with the ground, particularly, with the control ground 7 shown in FIG. 1 described above.

According to the present embodiment, the input terminal of the drive circuit 105 is connected with one end of the first base resistor Rb1 and one end of the fourth base resistor Rb4. The input terminal of the drive circuit 105 receives the voltage signal $V_{ECU}$ from the ECU 6. The other end of the fourth base resistor Rb4 is connected with the base of the fourth PNP transistor P-Tr4. The other end of the first base resistor Rb1 is connected with the base of the first NPN transistor N-Tr1.

The emitter of the first NPN transistor N-Tr1 is connected with the ground, particularly, with the control ground 7 show in FIG. 1 described above. The collector of the first NPN transistor N-Tr1 is connected with the other end of the twelfth resistor R12 and one end of the second base resistor Rb2. The other end of the second base resistor Rb2 is connected with the base of the first PNP transistor P-Tr1.

The collector of the first PNP transistor P-Tr1 is connected with one end of the output resistor Ro and the emitter of the fourth PNP transistor P-Tr4. The other end of the output resistor Ro is connected with the output terminal Vout of the drive circuit 105. The collector of the fourth PNP transistor P-Tr4 is connected with the collector of the fourth NPN transistor N-Tr4. The twelfth resistor R12, the second detection resistor Rd2, and the emitter of the first PNP transistor P-Tr1 receive a Hi-level signal from the ECU 6.

Besides having the same function as that of the drive circuit 11 according to the underlying technique shown in FIG. 19 described above, the drive circuit 105 according to the present embodiment is capable of detecting, as the voltage information, the current flowing from the control circuit to the drive circuit 105 side while the signal level of the output signal output from the drive circuit 105 is the Low level.

Thus, the overcurrent information or the abnormal temperature information can be transmitted from the drive circuit 105 to the ECU 6 that is the control computer by causing, at the occurrence of overcurrent or abnormal temperature, a current to flow through the drive circuit 105 using the electric charges in the external capacitor C1 on the control circuit side and monitoring the current through the drive circuit 105.

In particular, while the signal level of the output signal output from the drive circuit 105 is the Low level, the current flowing through the fourth NPN transistor N-Tr4 is substantially equal to the current flowing through the third NPN transistor N-Tr3. The voltage detection circuit 106 therefore detects the current flowing through the fourth NPN transistor N-Tr4 by converting the current into a voltage value through the second detection resistor Rd2.

The drive circuit 105 according to the present embodiment is the drive circuit compatible with, for example, the semiconductor device 55 or 70 according to the sixth or ninth embodiment described above. The drive circuit 105 according to the present embodiment is included in the semiconductor device 55 or 70 according to the sixth or ninth embodiment described above. Thus, as described above, at the occurrence of overcurrent or abnormal temperature, the changes in the consumption current in the control circuit are monitored through the drive circuit 105, so that the overcurrent information or the abnormal temperature information can be transmitted to the ECU 6 that is the control computer.

Fifteenth Embodiment

Figure 22:
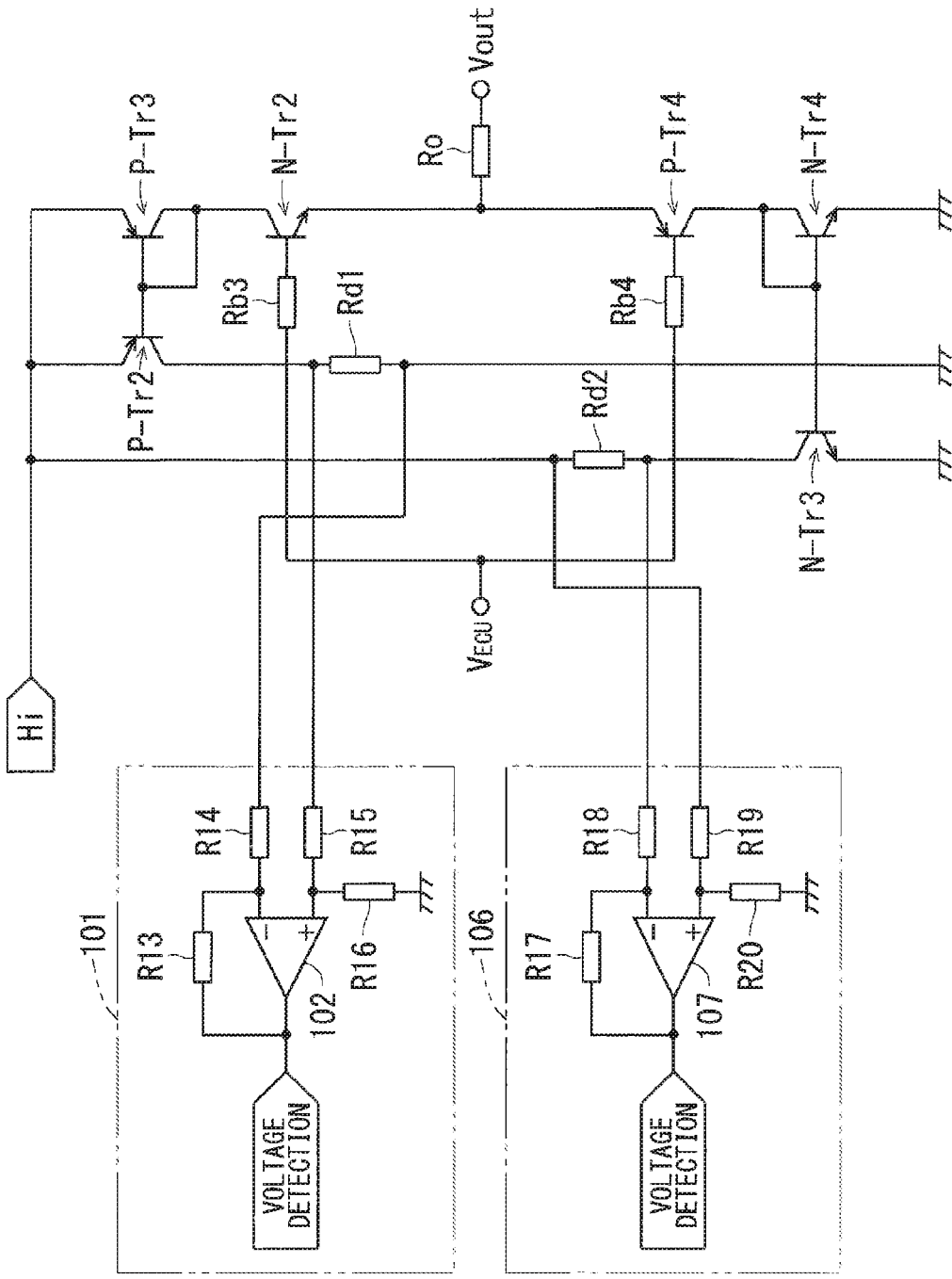
FIG. 22 A diagram showing a configuration of a drive circuit 110 according to a fifteenth embodiment of the present invention.

FIG. 22 is a diagram showing a configuration of a drive circuit 110 according to a fifteenth embodiment of the present invention. The drive circuit 110 according to the present embodiment, which is the combination of the drive circuit 100 according to the thirteenth embodiment shown in FIG. 20 and the drive circuit 105 according to the fourteenth embodiment shown in FIG. 21 described above, has the same configuration as that of drive circuits 100 and 105 according to the thirteenth and fourteenth embodiments.

According to the present embodiment, the drive circuit 110 includes the first voltage detection circuit 101, the second voltage detection circuit 106, the second PNP transistor P-Tr2, the third PNP transistor P-Tr3, the fourth PNP transistor P-Tr4, the second NPN transistor N-Tr2, the third NPN transistor N-Tr3, the fourth NPN transistor N-Tr4, the third base resistor Rb3, the fourth base resistor Rb4, the first detection resistor Rd1, the second detection resistor Rd2, and the output resistor Ro. The first voltage detection circuit 101 has the same configuration as that of the voltage detection circuit 101 according to the thirteenth embodiment shown in FIG. 20. The second voltage detection circuit 106 has the same configuration as that of the voltage detection circuit 106 according to the fourteenth embodiment shown in FIG. 21.

One end of the fourteenth resistor R14 of the first voltage detection circuit 101 is connected with the other end of the first detection resistor Rd1. The other end of the first detection resistor Rd1 is connected with the ground, particularly, with the control ground 7 shown in FIG. 1 described above. The other end of the fifteenth resistor R15 of the first voltage detection circuit 101 is connected with one end of the first detection resistor Rd1 and the collector of the second PNP transistor P-Tr2.

The emitter of the second PNP transistor P-Tr2 is connected with one end of the second detection resistor Rd2 and the emitter of the third PNP transistor P-Tr3. The base of the second PNP transistor P-Tr2 and the base of the third PNP transistor P-Tr3 are connected in common to be connected with the collector of the third PNP transistor P-Tr3.

The input terminal of the drive circuit 110 is connected with one end of the third base resistor Rb3 and one end of the fourth base resistor Rb4. The input terminal of the drive circuit 110 receives the voltage signal $V_{ECU}$ from the ECU 6. The other end of the third base resistor Rb3 is connected with the base of the second NPN transistor N-Tr2.

The collector of the second NPN transistor N-Tr2 is connected with the collector of the third PNP transistor P-Tr3. The emitter of the second NPN transistor N-Tr2 is connected with one end of the output resistor Ro and the emitter of the fourth PNP transistor P-Tr4. The other end of the output resistor Ro is connected with the output terminal Vout of the drive circuit 110. The other end of the fourth base resistor Rb4 is connected with the base of the fourth PNP transistor P-Tr4.

The other end of the eighteenth resistor R18 of the second voltage detection circuit 106 is connected with the other end of the second detection resistor Rd2 and the collector of the third NPN transistor N-Tr3. The other end of the nineteenth resistor R19 of the second voltage detection circuit 106 is connected with the one end of the second detection resistor Rd2 and the emitter of the second PNP transistor P-Tr2.

The emitter of the third NPN transistor N-Tr3 is connected with the ground, particularly, with the control ground 7 shown in FIG. 1 described above. The base of the third NPN transistor N-Tr3 and the base of the fourth NPN transistor N-Tr4 are connected in common to be connected with the collector of the fourth NPN transistor N-Tr4. The collector of the fourth NPN transistor N-Tr4 is connected with the collector of the fourth PNP transistor P-Tr4.

The emitter of the fourth NPN transistor N-Tr4 is connected with the ground, particularly, with the control ground 7 shown in FIG. 1 described above. The second detection resistor Rd2, the emitter of the second PNP transistor P-Tr2, and the emitter of the third PNP transistor P-Tr3 receive a Hi-level signal from the ECU 6.

The drive circuits 100 and 105 according to the thirteenth and fourteenth embodiments are capable of monitoring a current only in a case where the signal level of the output signal output from the drive circuit 100 or 105 is the Hi level or the Low level.

Meanwhile, the drive circuit 110 according to the present embodiment includes the first and second voltage detection circuits 101 and 106, and is therefore capable of monitoring the changes in current at the occurrence of overcurrent or abnormal temperature no matter whether the signal level of the output signal output from the drive circuit 110 is the Hi level or the Low level. Consequently, no matter whether the signal level of the output signal output from the drive circuit 110 is the Hi level or the Low level, the overcurrent information or the abnormal temperature information can be transmitted to the ECU 6 that is the control computer.

In particular, while the signal level of the output signal output from the drive circuit 110 is the Hi level, the current flowing through the third PNP transistor P-Tr3 is substantially equal to the current flowing through the second PNP transistor P-Tr2. Thus, the drive circuit 110 detects the current flowing through the second PNP transistor P-Tr2 by converting the current into a voltage value through the first detection resistor Rd1.

While the signal level of the output signal output from the drive circuit 110 is the Low level, the current flowing through the fourth NPN transistor N-Tr4 is substantially equal to the current flowing through the third NPN transistor N-Tr3. Thus, the drive circuit 110 detects the current flowing through the third NPN transistor N-Tr3 by converting the current into a voltage value through the second detection resistor Rd2.

The drive circuit 110 according to the present embodiment is the drive circuit compatible with, for example, the semiconductor device 60 or 75 according to the seventh or tenth embodiment described above. The drive circuit 110 according to the present embodiment is included in the semiconductor device 60 or 75 according to the seventh or tenth embodiment described above. Consequently, as described above, no matter whether the output signal from the drive circuit 110 is in the Hi level of the Low level, the changes in current at the occurrence of overcurrent or abnormal temperature are monitored through the drive circuit 110, so that the overcurrent information or the abnormal temperature information can be transmitted to the ECU 6 that is the control computer.

Sixteenth Embodiment

Figure 23:
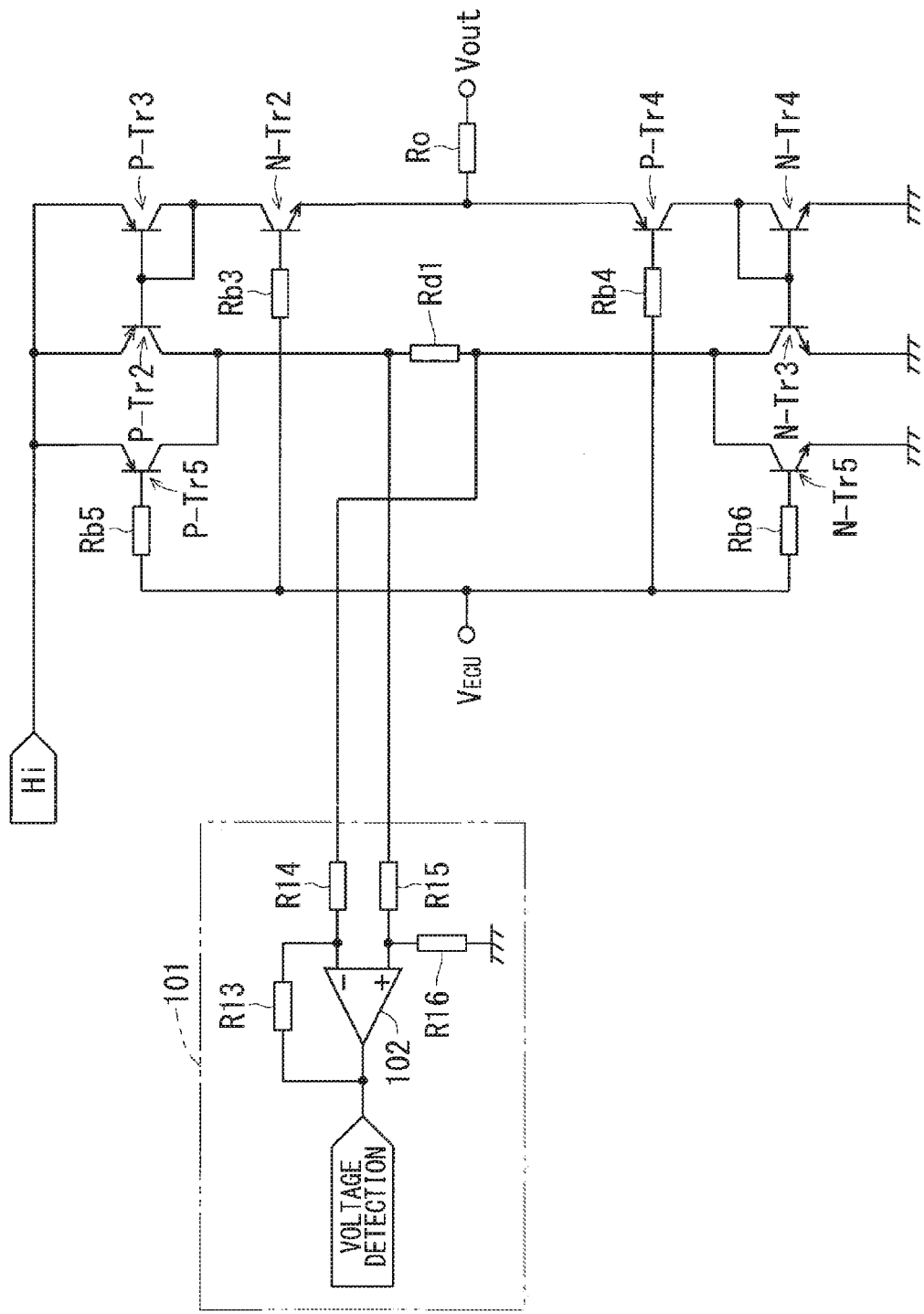
FIG. 23 A diagram showing a configuration of a drive circuit 115 according to a sixteenth embodiment of the present invention.

FIG. 23 is a diagram showing a configuration of a drive circuit 115 according to a sixteenth embodiment of the present invention. The configuration of the drive circuit 115 according to the present embodiment is similar to the configuration of the drive circuit 110 according to the fifteenth embodiment shown in FIG. 22 described above. Thus, the same reference signs indicate the same constituent components of the drive circuit 110, and a description applied in common is omitted.

According to the present embodiment, the drive circuit 115 includes the voltage detection circuit 101, the second PNP transistor P-Tr2, the third PNP transistor P-Tr3, the fourth PNP transistor P-Tr4, a fifth PNP transistor P-Tr5, the second NPN transistor N-Tr2, the third NPN transistor N-Tr3, the fourth NPN transistor N-Tr4, a fifth NPN transistor N-Tr5, the third base resistor Rb3, the fourth base resistor Rb4, a fifth base resistor Rb5, a sixth base resistor Rb6, the first detection resistor Rd1, and the output resistor Ro. The voltage detection circuit 101 according to the present embodiment has the same configuration as that of the voltage detection circuit 101 according to the thirteenth embodiment shown in FIG. 20.

According to the present embodiment, the input terminal of the drive circuit 115 is connected with one end of the third base resistor Rb3, one end of the fourth base resistor Rb4, one end of the fifth base resistor Rb5, and one end of the sixth base resistor Rb6. The input terminal of the drive circuit 115 receives the voltage signal $V_{ECU}$ from the ECU 6.

The Hi-level signal input from the ECU 6 is input to the emitter of the fifth PNP transistor P-Tr5, the emitter of the second PNP transistor P-Tr2, and the emitter of the third PNP transistor P-Tr3.

The other end of the fifth base resistor Rb5 is connected with the base of the fifth PNP transistor P-Tr5. The collector of the fifth PNP transistor P-Tr5 is connected with the collector of the second PNP transistor P-Tr2 and one end of the first detection resistor Rd1.

The other end of the sixth base resistor Rb6 is connected with the base of the fifth NPN transistor N-Tr5. The collector of the fifth NPN transistor N-Tr5 is connected with the collector of the third NPN transistor N-Tr3 and the other end of the first detection resistor Rd1. The emitter of the fifth NPN transistor N-Tr5 is connected with the ground, particularly, with the control ground 7 shown in FIG. 1 described above.

The drive circuit 110 according to the fifteenth embodiment shown in FIG. 22 described above require two detection resistors being the detection resistors Rd1 and Rd2 and two voltage detection circuits being the voltage detection circuits 101 and 106, possibly causing upsizing of the circuit.

In order to prevent upsizing of the circuit, the fifth PNP transistor P-Tr5 and the fifth NPN transistor N-Tr5 are added to the drive circuit 115 according to the present embodiment. This can integrate the detection resistor and the voltage detection circuit, allowing miniaturization of the circuit. In addition, the cost of the circuit can be reduced.

Seventeenth Embodiment

Figure 24:
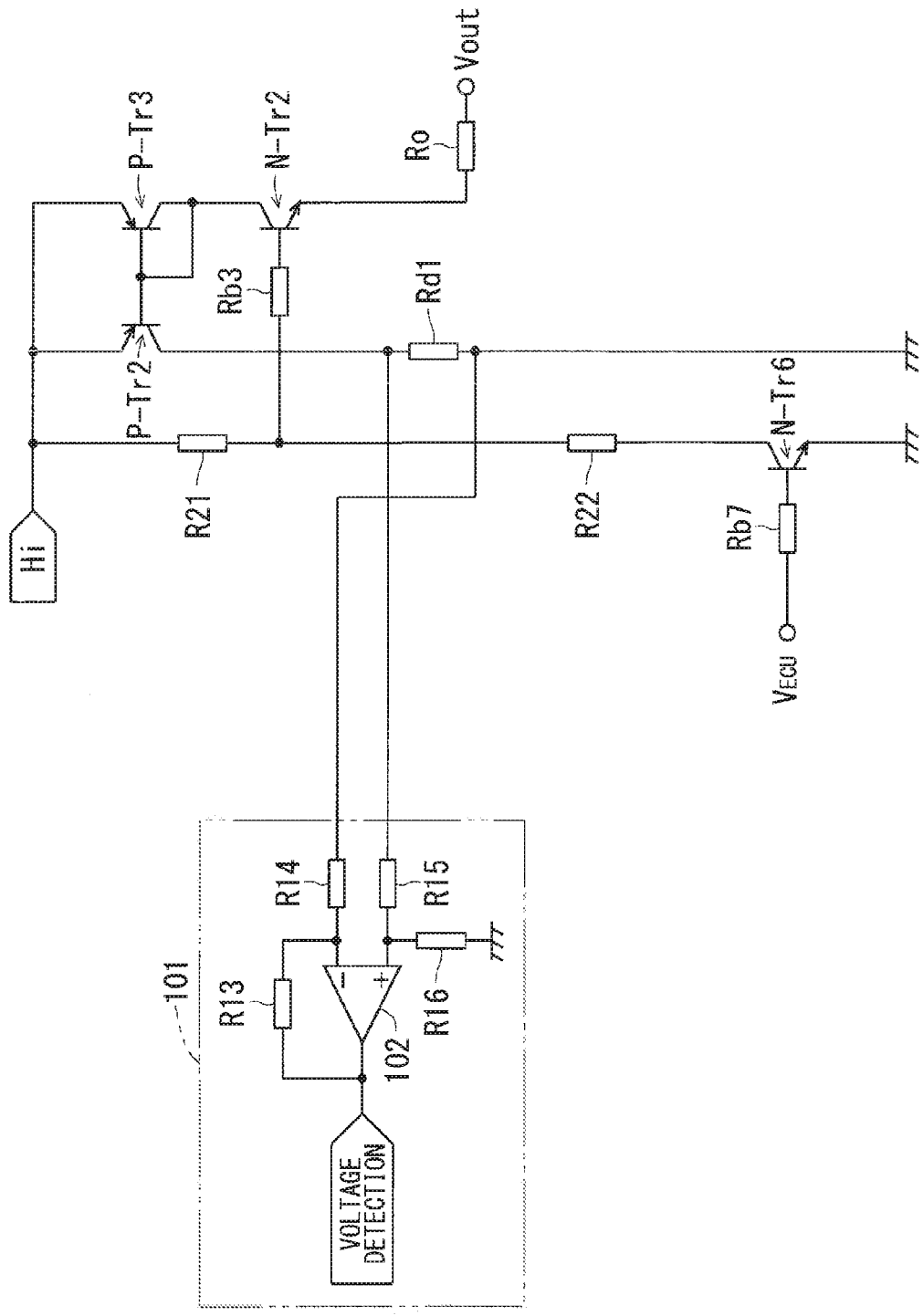
FIG. 24 A diagram showing a configuration of a drive circuit 120 according to a seventeenth embodiment of the present invention.

FIG. 24 is a diagram showing a configuration of a drive circuit 120 according to a seventeenth embodiment of the present invention. The configuration of the drive circuit 120 according to the present embodiment is similar to the configuration of the drive circuit 100 according to the thirteenth embodiment shown in FIG. 20 described above. Thus, the same reference signs indicate the same constituent components of the drive circuit 100, and a description applied in common is omitted.

The drive circuit 120 according to the present embodiment includes a sixth NPN transistor N-Tr6, a seventh base resistor Rb7, a twenty-first resistor R21, and a twenty-second resistor R22 besides the voltage detection circuit 101, the second PNP transistor P-Tr2, the third PNP transistor P-Tr3, the second NPN transistor N-Tr2, the detection resistor Rd1, the third base resistor Rb3, and the output resistor Ro included in the drive circuit 100 according to the thirteenth embodiment. The voltage detection circuit 101 has the same configuration as that of the voltage detection circuit 101 in FIG. 20.

According to the present embodiment, one end of the third base resistor Rb3 is connected with the other end of the twenty-first resistor R21 and one end of the twenty-second resistor R22. The Hi-level signal input from the ECU 6 is input to one end of the twenty-first resistor R21, the emitter of the second PNP transistor P-Tr2, and the emitter of the third PNP transistor P-Tr3.

The other end of the twenty-second resistor R22 is connected with the collector of the sixth NPN transistor N-Tr6. The emitter of the sixth NPN transistor N-Tr6 is connected with the ground, particularly, with the control ground 7 shown in FIG. 1 described above. The base of the sixth NPN transistor N-Tr6 is connected with the other end of the seventh base resistor Rb7. One end of the seventh base resistor Rb7 is connected with the input terminal of the drive circuit 120. The input terminal of the drive circuit 120 receives the voltage signal $V_{ECU}$ from the ECU 6.

The drive circuits 110 and 115 according to the fifteenth and sixteenth embodiments shown in FIGS. 22 and 23 described above monitor the current flowing toward the control circuit side, in other words, the consumption current in the control circuits while the signal level of the output signal output from the drive circuit 110 or 115 is the Hi level. While the signal level of the output signal output from the drive circuit 110 or 115 is the Low level, the current flowing toward the drive circuit 110 or 115 is monitored. Consequently, an overcurrent or an abnormal temperature is detected.

Meanwhile, as for the drive circuit 120 according to the present embodiment, whether the signal level of the output signal output from the drive circuit 120 is the Hi level or the Low level, a current flows toward the control circuit side.

The problem is the case in which the signal level of the output signal output from the drive circuit 120 is the Low level. For example, as for the drive circuits 110 and 115 according to the fifteenth and sixteenth embodiments shown in FIGS. 22 and 23 described above, the Low level of the output signal is equal to 0 V that is the ground potential, so that a current does not flow toward the control circuit side.

According to the present embodiment, the Low level of the output signal output from the drive circuit 120 is set within the range that does not exceed the threshold value of the circuit, which is, for example, about several hundred mV or more to about 1 V or less, through the voltage division between the twenty-first resistor R21 and the twenty-second resistor R22. This can cause a current to flow toward the control circuit side even if the signal level of the output signal output from the drive circuit 120 is the Low level.

According to the present embodiment as described above, the drive circuit 120 limits the control signal provided from the ECU 6 through the voltage division between the twenty-first resistor R21 and the twenty-second resistor R22 and outputs the resulting signal to the control circuit as the output signal that becomes the control signal Sd. The Low level of the control signal Sd is set at the predetermined value other than 0 V. This can cause a current to flow toward the control circuit side even if the signal level of the control signal Sd is the Low level.

The number of transistors can be reduced in the drive circuit 120 according to the present embodiment as compared with that of the drive circuits 110 and 115 according to the fifteenth and sixteenth embodiments, allowing for miniaturization. According to the present embodiment, when an abnormality such as an overcurrent or an abnormal temperature is detected while the signal level of the output signal output from the drive circuit 120 is the Low level, a current can flow through the control circuit without using the electric charges in the external capacitor C1. This prolongs the time period over which the semiconductor device can be driven.

According to the present embodiment, while the signal level of the output signal output from the drive circuit 120 is the Low level, the base voltage across the second NPN transistor N-Tr2 is determined through the voltage division between the resistors. The output voltage that is the output signal output from the output terminal Vout of the drive circuit 120 stands at the value reduced by about 0.7 V compared with the base voltage value of the second NPN transistor N-Tr2 at room temperature, which is, for example, 25° C. Thus, assuming that the base voltage across the second NPN transistor N-Tr2 is, for example, about 1.4 V, the output voltage output from the output terminal Vout of the drive circuit 120 is about 0.7 V.

The drive circuit 120 according to the present embodiment is the drive circuit compatible with, for example, the semiconductor device 90 according to the twelfth embodiment shown in FIG. 17 described above or the semiconductor device 95 according to the modification of the twelfth embodiment shown in FIG. 18 described above. The drive circuit 120 according to the present embodiment is included in the semiconductor device 90 according to the twelfth embodiment described above or the semiconductor device 95 according to the modification of the twelfth embodiment, to thereby reduce the size of the semiconductor devices 90 and 95 and to prolong the time period over which the semiconductor devices 90 and 95 can be driven.

Eighteenth Embodiment

FIG. 25 is a diagram showing a configuration of a drive circuit 125 according to an eighteenth embodiment of the present invention. The configuration of the drive circuit 125 according to the present embodiment is similar to the configuration of the drive circuit 120 according to the seventeenth embodiment shown in FIG. 24 described above. Thus, the same reference signs indicate the same constituent components of the drive circuit 120, and a description applied in common is omitted.

The drive circuit 125 according to the present embodiment includes a first diode D1 and a second diode D2 in place of the twenty-second resistor R22 of the drive circuit 120 according to the seventeenth embodiment shown in FIG. 24 described above.

In particular, the drive circuit 125 according to the present embodiment includes the voltage detection circuit 101, the second PNP transistor P-Tr2, the third PNP transistor P-Tr3, the second NPN transistor N-Tr2, the sixth NPN transistor N-Tr6, the first diode D1, the second diode D2, the third base resistor Rb3, the seventh base resistor Rb7, the twenty-first resistor R21, the detection resistor Rd1, and the output resistor Ro.

The anode of the first diode D1 is connected with the other end of the twenty-first resistor R21. The cathode of the first diode D1 is connected with the anode of the second diode D2. The cathode of the second diode D2 is connected with the collector of the sixth NPN transistor N-Tr6.

As for the drive circuit 120 according to the seventeenth embodiment shown in FIG. 24 described above, the base voltage across the second NPN transistor N-Tr2 is provided by dividing the voltage between the resistors through the third base resistor Rb3. In this case, the second NPN transistor N-Tr2 may malfunction when the Hi-level signal input from the ECU 6 that is the control computer fluctuates due to, for example, noise or surge.

Thus, as for the drive circuit 125 according to the present embodiment, the first and second diodes D1 and D2 are located between the sixth NPN transistor N-Tr6 and the third base resistor Rb3, such that the base voltage across the second NPN transistor N-Tr2 is provided through the use of the forward drop voltage across the first and second diodes D1 and D2. Consequently, the stable base voltage can be secured even if the Hi-level signal input from the ECU 6 fluctuates due to, for example, noise or surge, thereby regulating the malfunctioning of the second NPN transistor Tr2.

According to the present embodiment as described above, the drive circuit 125 outputs the control signal provided from the ECU 6 to the control circuit through the first and second diodes D1 and D2 as the output signal that becomes the control signal Sd. Consequently, the stable base voltage can be secured even if the Hi-level signal input from the ECU 6 as the control signal fluctuates due to, for example, noise or surge. This can regulate the malfunctioning of the second NPN transistor Tr2.

According to the present embodiment, the first and second diodes D1 and D2 are provided in place of the twenty-second resistor R22 as described above, so that a voltage of about 1.4 V is applied to the base voltage across the second NPN transistor N-Tr2 while the signal level of the output signal output from the drive circuit 125 is the Low level. At room temperature, for example, at 25° C., the output voltage output from the output terminal Vout of the drive circuit 125 has the value reduced by about 0.7 V as compared with the base voltage value of the second NPN transistor N-Tr2, thus standing at about 0.7 V.

The number of diodes included in the drive circuit 125 is not limited to two and may be designed freely as long as the Low level of the output voltage output from the output terminal Vout of the drive circuit 125 falls within the range that does not exceed the threshold value of the circuit.

The drive circuit 125 according to the present embodiment is the drive circuit compatible with, for example, the semiconductor device 90 according to the twelfth embodiment shown in FIG. 17 described above or the semiconductor device 95 according to the modification of the twelfth embodiment shown in FIG. 18 described above. The drive circuit 125 according to the present embodiment is included in the semiconductor device 90 according to the twelfth embodiment or the semiconductor device 95 according to the modification of the twelfth embodiment described above, to thereby reduce the size of the semiconductor devices 90 and 95 and to prolong the time period over which the semiconductor devices 90 and 95 can be driven.

In the present invention, the above embodiments can be arbitrarily combined within the scope of the invention. Moreover, any constituent component in each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1, 30, 35, 40, 45, 50, 55, 60, 65, 70, 75, 80, 85, 90, 95 semiconductor device, 2 integrated circuit, 3 switching element part, 4 ignition transformer, 5 ignition plug, 6 electronic control unit (ECU), 10 ignition device, 11, 100, 105, 110, 115, 120, 125 drive circuit, 12, 31, 36, 41, 46, 51, 56, 61, 66, 71, 76, 81, 86, 91, 96 control circuit, 52 current detection circuit, 67 temperature detection circuit, 101 voltage detection circuit (first voltage detection circuit), 106 voltage detection circuit (second voltage detection circuit).

The invention claimed is:
1. A semiconductor device comprising:
a switching element;
a drive circuit that outputs, on the basis of a control signal provided from an external control device, a drive control signal for driving said switching element; and
a control circuit that controls driving of said switching element on the basis of said drive control signal output from said drive circuit, wherein
said drive circuit is configured to
output said drive control signal in a low level having a relatively low signal level in a case where said control signal is a signal for driving said switching element; and
output said drive control signal in a high level having a relatively high signal level in a case where said control signal is a signal for stopping the driving of said switching element,
said control circuit includes an electric charge storing capacitor for storing electric charges and is configured to
stop the driving of said switching element and charge said electric charge storing capacitor in a case where said drive control signal output from said drive circuit is in the high level, and
drive said switching element using electric charges stored in said electric charge storing capacitor in a case where said drive control signal output from said drive circuit is in the low level.

2. The semiconductor device according to claim 1, wherein said control circuit includes a discharge impedance adjustment circuit that adjusts a discharge impedance from said switching element.

3. The semiconductor device according to claim 1, wherein said control circuit includes:
   an electric-charge-backflow-preventing Schottky barrier diode for preventing a backflow of electric charges from said electric charge storing capacitor; and
   a field-effect transistor located between an anode and a cathode of said electric-charge-backflow-preventing Schottky barrier diode.

4. The semiconductor device according to claim 1, wherein said control circuit includes an electric discharge regulating circuit that regulates discharge of electric charges stored in said electric charge storing capacitor when said drive control signal output from said drive circuit is switched from the high level to the low level.

5. The semiconductor device according to claim 1, wherein said control circuit includes:
   a current detection circuit that detects a current flowing through said switching element; and
   a circuit that increases a consumption current in said control circuit when the current flowing through said switching element and detected by said current detection circuit exceeds a predetermined current value while said drive control signal output from said drive circuit is in the high level.

6. The semiconductor device according to claim 1, wherein said control circuit includes:
   a current detection circuit that detects a current flowing through said switching element; and
   a circuit that causes a current to flow through said drive circuit using electric charges stored in said electric charge storing capacitor when the current flowing through said switching element and detected by said current detection circuit exceeds a predetermined current value while said drive control signal output from said drive circuit is in the low level.

7. The semiconductor device according to claim 1, wherein said control circuit includes:
   a current detection circuit that detects a current flowing through said switching element;
   a circuit that increases a consumption current in said control circuit when the current flowing through said switching element and detected by said current detection circuit exceeds a predetermined current value while said drive control signal output from said drive circuit is in the high level; and
   a circuit that causes a current to flow through said drive circuit using electric charges stored in said electric charge storing capacitor when the current flowing through said switching element and detected by said current detection circuit exceeds the predetermined current value while said drive control signal output from said drive circuit is in the low level.

8. The semiconductor device according to claim 1, wherein said control circuit includes:
   a temperature detection circuit that detects a temperature; and
   a circuit that increases a consumption current in said control circuit when the temperature detected by said temperature detection circuit exceeds a predetermined temperature while said drive control signal output from said drive circuit is in the high level.

9. The semiconductor device according to claim 1, wherein said control circuit includes:
   a temperature detection circuit that detects a temperature; and
   a circuit that causes a current to flow through said drive circuit using electric charges stored in said electric charge storing capacitor when the temperature detected by said temperature detection circuit exceeds a predetermined temperature while said drive control signal output from said drive circuit is in the low level.

10. The semiconductor device according to claim 1, wherein said control circuit includes:
    a temperature detection circuit that detects a temperature;
    a circuit that increases a consumption current in said control circuit when the temperature detected by said temperature detection circuit exceeds a predetermined temperature while said drive control signal output from said drive circuit is in the high level; and
    a circuit that causes a current to flow through said drive circuit using electric charges stored in said electric charge storing capacitor when the temperature detected by said temperature detection circuit exceeds the predetermined temperature while said drive control signal output from said drive circuit is in the low level.

11. The semiconductor device according to claim 5, wherein said control circuit includes a field-effect transistor between said circuit that increases a consumption current and a power source.

12. The semiconductor device according to claim 8, wherein said control circuit includes a field-effect transistor between said circuit that increases a consumption current and a power source.

13. The semiconductor device according to claim 5, wherein said circuit that increases a consumption current is connected with said drive circuit through a Schottky barrier diode.

14. The semiconductor device according to claim 8, wherein said circuit that increases a consumption current is connected with said drive circuit through a Schottky barrier diode.

15. The semiconductor device according to claim 5, wherein said drive circuit has a function of detecting a consumption current in said control circuit as voltage information when said drive control signal is in the high level.

16. The semiconductor device according to claim 6, wherein said drive circuit has a function of detecting a current flowing from said control circuit into said drive circuit as voltage information when said drive control signal is in the low level.

17. The semiconductor device according to claim 7, wherein said drive circuit has:
    a function of detecting a current consumed by said control circuit as voltage information when said drive control signal is in the high level; and
    a function of detecting a current flowing from said control circuit into said drive circuit as voltage information when said drive control signal is in the low level.

18. The semiconductor device according to claim 17, wherein the same circuit provides the function of detecting said voltage information in a case where said drive control signal is in the high level and the function of detecting said voltage information in a case where said drive control signal is in the low level.

19. The semiconductor device according to claim 13, wherein said drive circuit limits, through voltage division between a plurality of resistors, said control signal provided from said control device and outputs a resulting control signal to said control circuit as said drive control signal.

20. The semiconductor device according to claim 13, wherein said drive circuit outputs said control signal, provided from said control device, to said control circuit as said drive control signal through a diode.

* * * * *